(12) United States Patent
Suzuki et al.

(10) Patent No.: US 10,347,811 B2
(45) Date of Patent: Jul. 9, 2019

(54) THERMOELECTRIC CONVERSION MODULE

(71) Applicant: FUJIFILM Corporation, Tokyo (JP)

(72) Inventors: Hideyuki Suzuki, Ashigara-kami-gun (JP); Shinji Imai, Ashigara-kami-gun (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 0 days.

(21) Appl. No.: 16/001,157

(22) Filed: Jun. 6, 2018

(65) Prior Publication Data

US 2018/0351070 A1 Dec. 6, 2018

Related U.S. Application Data

(63) Continuation of application No. PCT/JP2016/085766, filed on Dec. 1, 2016.

(30) Foreign Application Priority Data

Dec. 21, 2015 (JP) .................. 2015-248424

(51) Int. Cl.
*H01L 35/32* (2006.01)
*H01L 35/30* (2006.01)
(Continued)

(52) U.S. Cl.
CPC .............. *H01L 35/32* (2013.01); *H01L 35/08* (2013.01); *H01L 35/24* (2013.01); *H01L 35/30* (2013.01); *H01L 35/34* (2013.01); *H02N 11/00* (2013.01)

(58) Field of Classification Search
CPC ......... H01L 35/30; H01L 35/32; H01L 35/34; H01L 35/08; H01L 35/24
See application file for complete search history.

(56) References Cited

U.S. PATENT DOCUMENTS 4,859,250 A * 8/1989 Buist ............... F25B 21/02
136/225
6,096,964 A * 8/2000 Ghamaty ............. H01L 35/26
136/201
(Continued)

FOREIGN PATENT DOCUMENTS

JP          6-151979 A      5/1994
JP       2004-281666 A     10/2004
(Continued)

OTHER PUBLICATIONS

International Search Report dated Feb. 7, 2017 issued by the International Searching Authority in No. PCT/JP2016/085766.
(Continued)

*Primary Examiner* — Golam Mowla
(74) *Attorney, Agent, or Firm* — Sughrue Mion, PLLC

(57) ABSTRACT

Provided is a thermoelectric conversion module which is folded in a bellows-like shape and is capable of preventing a thermoelectric conversion layer from coming into contact with other member even in a state in which bellows is closed and performing highly effective power generation. This thermoelectric conversion module includes a bellows-like substrate, P-type and N-type thermoelectric conversion layers which are alternately provided on each sloped surface of the substrate on one surface of the substrate, a top portion electrode which connects the P-type and N-type thermoelectric conversion layers over a top portion and a bottom portion electrode which connects P-type and N-type thermoelectric conversion layers over a bottom portion, in which the P-type and N-type thermoelectric conversion layers do not extend over the top portion and the bottom portion, and positions of the P-type thermoelectric conversion layer and the N-type thermoelectric conversion layer
(Continued)

which face each other are not overlapped as viewed in the arrangement direction.

12 Claims, 8 Drawing Sheets

(51) Int. Cl.
*H02N 11/00* (2006.01)
*H01L 35/08* (2006.01)
*H01L 35/24* (2006.01)
*H01L 35/34* (2006.01)

(56) References Cited

U.S. PATENT DOCUMENTS

| | | | | |
|---|---|---|---|---|
| 6,096,965 | A * | 8/2000 | Ghamaty | H01L 35/26 136/201 |
| 6,828,579 | B2 * | 12/2004 | Ghamaty | H01L 29/155 257/12 |
| 2005/0115601 | A1 * | 6/2005 | Olsen | H01L 35/08 136/212 |
| 2005/0139250 | A1 * | 6/2005 | DeSteese | H01L 35/08 136/212 |
| 2007/0125413 | A1 * | 6/2007 | Olsen | H01L 35/08 136/205 |
| 2009/0152873 | A1 * | 6/2009 | Gangopadhyay | C06B 45/14 290/1 R |
| 2011/0214707 | A1 | 9/2011 | Suzuki et al. | |
| 2011/0220162 | A1 | 9/2011 | Siivola et al. | |
| 2014/0318591 | A1 | 10/2014 | Shelby et al. | |

FOREIGN PATENT DOCUMENTS

| | | |
|---|---|---|
| JP | 2005-328000 A | 11/2005 |
| JP | 2008-130813 A | 6/2008 |
| JP | 2008-205129 A | 9/2008 |
| JP | 2012-80059 A | 4/2012 |
| JP | 2014-146640 A | 8/2014 |
| WO | 2013/114854 A1 | 8/2013 |

OTHER PUBLICATIONS

International Preliminary Report on Patentability with the translation of Written Opinion dated Jun. 26, 2018 issued by the International Bureau in No. PCT/JP2016/085766.

* cited by examiner

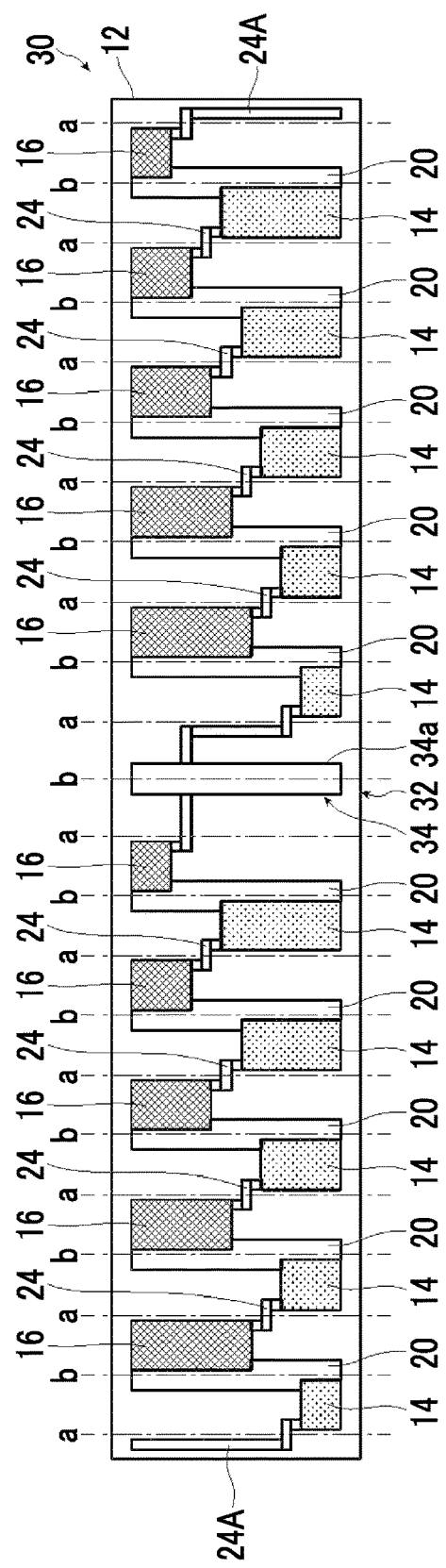

THERMOELECTRIC CONVERSION MODULE

CROSS-REFERENCE TO RELATED APPLICATIONS

This application is a Continuation of PCT International Application No. PCT/JP2016/085766 filed on Dec. 1, 2016, which claims priority under 35 U.S.C. § 119(a) to Japanese Patent Application No. 2015-248424 filed on Dec. 21, 2015. The above application is hereby expressly incorporated by reference, in its entirety, into the present application.

BACKGROUND OF THE INVENTION

1. Field of the Invention

The present invention relates to a thermoelectric conversion module having good thermoelectric conversion performance.

2. Description of the Related Art

Thermoelectric conversion materials capable of converting heat energy to electrical energy and vice versa are used in thermoelectric conversion elements such as power generation elements or Peltier elements which generate power using heat.

Thermoelectric conversion elements are capable of directly converting heat energy to electric power and, advantageously, do not require any movable portions. Therefore, thermoelectric conversion modules (power generation devices) obtained by connecting a plurality of thermoelectric conversion elements are capable of easily obtaining electric power without the need of operation costs by being provided in, for example, heat discharging portions of incineration furnaces, various facilities in plants, and the like.

Thermoelectric conversion elements are normally used for a thermoelectric conversion module formed by connecting a plurality of thermoelectric conversion elements in series. As a thermoelectric conversion module, a so-called π-type thermoelectric conversion module using a thermoelectric conversion material such as Bi—Te has been known.

For example, a π-type thermoelectric conversion module is prepared by processing P-type and N-type thermoelectric conversion materials into a block shape, alternately arranging the thermoelectric conversion materials on a substrate of ceramic or the like, and connecting the arranged thermoelectric conversion materials in series.

For such a π-type thermoelectric conversion module, labor for processing of thermoelectric conversion materials into a block shape, arrangement of thermoelectric conversion materials, connection of the thermoelectric conversion materials by electrode, and the like is required.

In contrast, a thermoelectric conversion module having a thermoelectric conversion layer and an electrode formed on an insulating substrate having flexibility, such as a resin film, by a coating method such as printing or a vacuum film formation method such as vacuum vapor deposition has been reported.

For example, JP2005-328000A discloses a thermoelectric conversion module including an insulating sheet having flexibility, in which a plurality of top portions projecting to a surface side and a plurality of bottom portions projecting to a rear surface side are formed by forming a bellows-like (waveform) shape, and a thermocouple having a first contact and a second contact provided on the insulating sheet, in which the first contact is arranged at a top portion adjacent portion adjacent to the top portion, and the second contact is arranged at a bottom portion adjacent portion adjacent to the bottom portion.

In addition, WO2013/114854A discloses a thermoelectric conversion module including a flexible base material having a bellows-like shape (waveform structure) wherein bottom portions and top portions are alternately repeated, a first thermoelectric conversion layer formed on the base material along a first sloped surface between the top portion and a first bottom portion connected to the top portion, and a second thermoelectric conversion layer formed along a second sloped surface between the top portion and a second bottom portion connected to the top portion, in which the first thermoelectric conversion layer and the second thermoelectric conversion layer have the same shape, the first thermoelectric conversion layer and the second thermoelectric conversion layer have connection points to wiring, at the top portion side and the first bottom portion side, and at the top portion side and the second bottom portion side, respectively.

In such thermoelectric conversion modules using a resin film or the like as a substrate, the thermoelectric conversion layers and electrodes can be formed by a coating method using an ink-like thermoelectric conversion material or electrode material, a vacuum film formation method such as vacuum vapor deposition of a thermoelectric conversion material and an electrode material, and the like.

Therefore, this thermoelectric conversion module can be easily produced and the production cost can be reduced compared to a π-type thermoelectric conversion module using a block-shaped thermoelectric conversion material.

In addition, because an electromotive force of one thermoelectric conversion element is very small, it is necessary for a thermoelectric conversion module to increase the voltage and the power generation capacity by connecting several hundreds or more of thermoelectric conversion elements in series. In contrast, the thermoelectric conversion module using a resin film or the like as a substrate can easily cope with the formation of a plurality of thermoelectric conversion elements by printing or the like.

SUMMARY OF THE INVENTION

As shown in JP2005-328000A and WO2013/114854A, it is considered that the thermoelectric conversion module using a substrate having flexibility such as a resin film is folded in a bellows-like shape and then is used. Here, in a thermoelectric conversion module of the related art having a shape formed by folding the substrate in a bellows-like shape, a sloped surface of the bellows on which a thermoelectric conversion layer or the like is formed is separated from the facing sloped surface.

However, in such a thermoelectric conversion module having a bellows-like folded shape is advantageous, from the viewpoint of being capable of reducing the size, improving heat transfer efficiency, improving the mounting density of the thermoelectric conversion element, and the like, it is advantageous to compress the folded substrate in the arrangement direction of the thermoelectric conversion layer to close the bellows as much as possible.

In contrast, in a case where the bellows is closed in the bellows-like thermoelectric conversion module of the related art, the thermoelectric conversion layers, the electrodes, or the thermoelectric conversion layer and the electrode come into contact with each other to cause a short circuit, and thus power is not generated at all.

Such a short circuit can be solved by covering the thermoelectric conversion layer and the electrode by an insulating layer.

However, in consideration of the heat transfer efficiency in the thermoelectric conversion layer, that is, the power generation efficiency of the thermoelectric conversion module, it is preferable that a member which has an influence on heat transfer is not brought into contact with a thermoelectric conversion layer as much as possible. In a case where there is a possibility of contact between the thermoelectric conversion layer and the electrode, even in a state in which an insulating layer is provided on only the electrode without providing an insulating layer on the thermoelectric conversion layer, the insulating layer of the electrode and the thermoelectric conversion layer come into contact with each other by closing the bellows, and thus the heat transfer efficiency of the thermoelectric conversion layer is influenced.

An object of the present invention is to solve the problems in the related art and to provide a thermoelectric conversion module, which has a P-type thermoelectric conversion layer and an N-type thermoelectric conversion layer alternately formed on sloped surfaces of a substrate folded in a bellows-like shape and is capable of preventing the thermoelectric conversion layer from coming into contact with members other than the substrate even in a case where the bellows is closed by compression and performing highly effective power generation as used in a state in which the bellows is closed.

In order to achieve the above object, according to the present invention, there is provided a thermoelectric conversion module comprising:

a substrate which is folded in a bellows-like shape;

a P-type thermoelectric conversion layer and an N-type thermoelectric conversion layer which are alternately provided on each sloped surface between top portions and bottom portions of folds of the substrate on one surface of the substrate; and a top portion electrode which connects the P-type thermoelectric conversion layer and the N-type thermoelectric conversion layer adjacent to each other in an arrangement direction of the P-type thermoelectric conversion layer and the N-type thermoelectric conversion layer over one top portion, and a bottom portion electrode which connects the P-type thermoelectric conversion layer and the N-type thermoelectric conversion layer adjacent to each other in the arrangement direction over one bottom portion, in which the P-type thermoelectric conversion layer and the N-type thermoelectric conversion layer do not extend over the top portion and the bottom portion and positions of the P-type thermoelectric conversion layer and the N-type thermoelectric conversion layer which face each other are not overlapped as viewed in the arrangement direction.

In the thermoelectric conversion module of the present invention, it is preferable that a size of one of the P-type thermoelectric conversion layer and the N-type thermoelectric conversion layer in a width direction orthogonal to the arrangement direction is gradually increased and a size of the other in the width direction is gradually decreased in the arrangement direction, and facing portions of the top portion electrodes adjacent to each other in the arrangement direction among the top portion electrodes are not overlapped with each other as viewed in the arrangement direction.

It is preferable that the top portion electrode includes a main body portion which extends over the top portion, a first connection portion which connects the main body portion and the P-type thermoelectric conversion layer without extending over the top portion, and a second connection portion which connects the main body portion and the N-type thermoelectric conversion layer without extending over the top portion, and the main body portions of the top portion electrodes adjacent to each other in the arrangement direction are not overlapped with each other as viewed in the arrangement direction.

It is preferable that the thermoelectric conversion module further comprises, on the facing sloped surfaces in the middle of the arrangement direction, a reset portion which does not have the thermoelectric conversion layers and has a connection electrode that connects the P-type thermoelectric conversion layer and the N-type thermoelectric conversion layer formed on the sloped surfaces on both sides in the arrangement direction.

It is preferable that a relationship in size in a width direction between the P-type thermoelectric conversion layer and the N-type thermoelectric conversion layer on the facing sloped surfaces positioned on both sides of the reset portion in the arrangement direction is mutually reversed.

It is preferable that the thermoelectric conversion module further includes an insulating member which covers the top portion electrode.

It is preferable that the insulating member is an insulating sheet-like material folded in a bellows-like shape.

It is preferable that the insulating member has a thermal conductive layer on one surface of the insulating sheet-like material.

It is preferable that the thermoelectric conversion module further includes a compression member which compresses the substrate in the arrangement direction.

It is preferable that the compression member has a through hole which is formed on the sloped surface of the substrate, and a wire which is inserted into the through hole.

It is preferable that the through hole is positioned at positions other than the positions where the P-type thermoelectric conversion layer, the N-type thermoelectric conversion layer, the top portion electrode, and the bottom portion electrode are formed.

It is preferable that at least one of the top portion electrode or the bottom portion electrode has a broken cut line matching with a folding line of the substrate.

According to the present invention, since the thermoelectric conversion layer can be prevented from coming into contact with members other than the substrate even in a state in which the bellows of the bellows-like thermoelectric conversion module is closed, it is possible to perform highly effective power generation in a state in which the bellows is closed.

BRIEF DESCRIPTION OF THE DRAWINGS

FIG. 3 is a view conceptually showing still another example of the thermoelectric conversion module of the present invention.

DESCRIPTION OF THE PREFERRED EMBODIMENTS

Hereinafter, a thermoelectric conversion module of the present invention will be described in detail based on preferable embodiments shown in the accompanying drawings.

In the present specification, a numerical range represented by using "to" indicates a range including the numerical values before and after "to" as the lower limit and the upper limit.

A thermoelectric conversion module of the present invention has a bellows-like folded substrate which is alternately mountain-folded and valley-folded to alternately form top portions (mountain portions) and bottom portions (valley portions) by folding. The thermoelectric conversion module of the present invention has a P-type thermoelectric conversion layer and an N-type thermoelectric conversion layer alternately formed on each sloped surface between the top portions and the bottom portion on one surface of such a bellows-like substrate. In other words, the thermoelectric conversion module of the present invention has the P-type thermoelectric conversion layer on each sloped surface of the substrate formed by folding and has the N-type thermoelectric conversion layer on each sloped surface on which the P-type thermoelectric conversion layer is formed.

Further, adjacent P-type thermoelectric conversion layer and N-type thermoelectric conversion layer are connected to the top portion and the bottom portion in series by a top portion electrode and a bottom portion electrode.

Figure 1A:
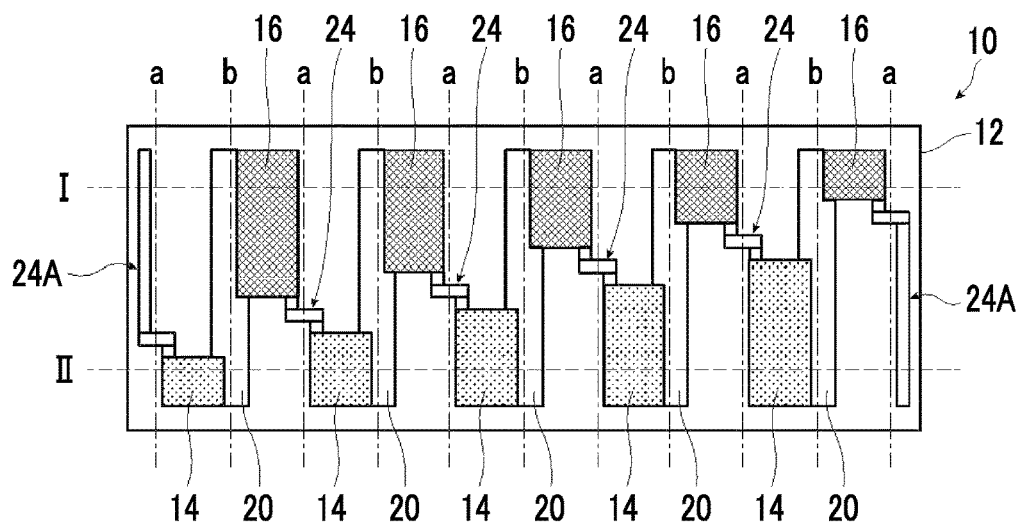
FIG. 1A is a view conceptually showing a state in which a bellows of a thermoelectric conversion module of the present invention is opened.

FIG. 1A is a view conceptually showing a state in which a bellows of a thermoelectric conversion module 10 of the present invention is opened and a substrate 12 is spread in a plane shape.

Figure 1B:
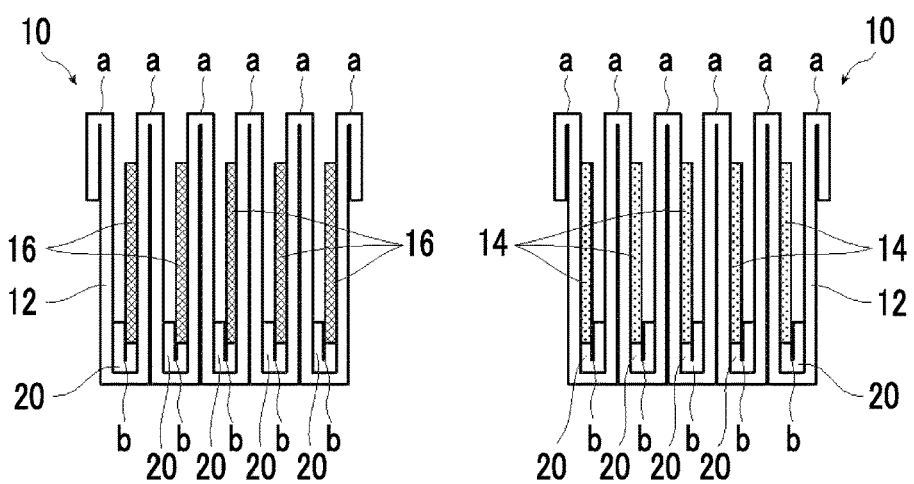
FIG. 1B is a view conceptually showing the thermoelectric conversion module of the present invention.

FIG. 1B conceptually shows an example of the thermoelectric conversion module 10 of the present invention in a state in which the bellows is closed. The left side in FIG. 1B is a view showing the thermoelectric conversion module 10 as viewed from the upper side in FIG. 1A at a position indicated by a broken line I in FIG. 1A. In addition, the right side in FIG. 1B is a view showing the thermoelectric conversion module 10 as viewed from the lower side in FIG. 1A at a position indicated by a broken line II in FIG. 1A.

In FIG. 1B, the folded portions of the bellows-like substrate 12 are shown in a rectangular shape in order to clearly show the configuration and each member of the thermoelectric conversion module 10.

Figure 1C:
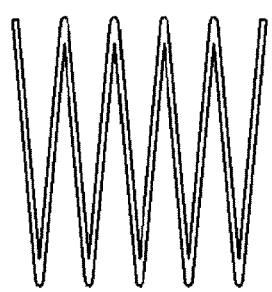
FIG. 1C is a view conceptually showing the thermoelectric conversion module of the present invention.

However, in the thermoelectric conversion module 10 of the present invention, the folded portions of the substrate 12, that is, the top portions and the bottom portions, which will be described later, are formed by folding the substrate 12 at an acute angle along a linear folding line as conceptually shown in FIG. 1C. That is, as conceptually shown in FIG. 1C, the thermoelectric conversion module of the present invention has a bellows-like shape formed by connecting a plurality of Ws in a horizontal direction. Regarding this point, the same applies to another example of the present invention, which will be described later.

As shown in FIGS. 1A and 1B, the thermoelectric conversion module 10 of the present invention is configured to include the substrate 12 which is folded in a bellows-like shape, and the P-type thermoelectric conversion layer 14, the N-type thermoelectric conversion layer 16, a bottom portion electrode 20, and a top portion electrode 24, which are formed on one surface of the substrate 12.

In order to clearly show the configuration of the thermoelectric conversion module 10, in FIGS. 1A and 1B, the P-type thermoelectric conversion layer 14 and the N-type thermoelectric conversion layer 16 are shown with a half-tone dot. Regarding this point, the same applies to another example.

In FIG. 1A, the substrate 12 is alternately mountain-folded and valley-folded at folding lines indicated by dashed lines and set at equal intervals in a longitudinal direction and is folded in a bellows-like shape. In the present invention, the mountain folding and the valley folding are based on a formation surface such as a thermoelectric conversion layer, a method of folding the formation surface such as a thermoelectric conversion layer in a convex shape is mountain folding, and a method of folding the formation surface such as a thermoelectric conversion layer into a concave shape is valley folding.

In FIG. 1A, a dashed line a and a dashed line b are alternately set. The substrate 12 (thermoelectric conversion module 10) is mountain-folded at the dashed line a and valley-folded at the dashed line b to be folded in a bellows-like shape. Accordingly, a position indicated by the dashed line a is a top portion of a bellows formed by folding of the substrate 12 and a position indicated by the dashed line b is a bottom portion of the bellows formed by folding of the substrate 12.

In the following description, the top portion of the bellows formed by folding of the substrate 12, that is, a position of the dashed line a in FIG. 1A is referred to as a "top portion a". In addition, the bottom portion of the bellows formed by the folding of the substrate 12, that is, a position of the dashed line b in FIG. 1A is referred to as a "bottom portion b".

In the substrate 12, the P-type thermoelectric conversion layer 14 and the N-type thermoelectric conversion layer 16 are alternately provided on each sloped surface between the top portions a and the bottom portions b.

In the example of the drawing, in a direction from the left to the right in the drawing, the P-type thermoelectric conversion layer 14 is provided on the sloped surface reaching from the top portion a to the bottom portion b and the N-type thermoelectric conversion layer 16 is provided on the sloped surface reaching from the bottom portion b to the top portion a.

In the following description, a direction in which the P-type thermoelectric conversion layer 14 and the N-type thermoelectric conversion layer 16 are alternately formed, that is, the longitudinal direction of the substrate 12 in the example of the drawing is referred to as an "arrangement direction". In addition, a direction orthogonal to the arrangement direction, that is, the lateral direction of the substrate 12 in the example of the drawing is referred to as a "width direction". Accordingly, in FIG. 1C, a horizontal direction in the drawing is the arrangement direction and a direction vertical to a paper plane is the width direction.

On the substrate 12, the bottom portion electrode 20 which connects the P-type thermoelectric conversion layer 14 and the N-type thermoelectric conversion layer 16 over one bottom portion b is formed. In addition, on the substrate 12, the top portion electrode 24 which connects the N-type thermoelectric conversion layer 16 and the P-type thermoelectric conversion layer 14 over one top portion a. In the present invention, the expression "over the top portion a and the bottom portion b" means that the electrode extends in the arrangement direction.

Accordingly, the thermoelectric conversion module 10 in the example of the drawing has a configuration in which five thermoelectric conversion elements each including a part of the substrate 12, the P-type thermoelectric conversion layer 14 and the N-type thermoelectric conversion layer 16, the bottom portion electrode 20, and the top portion electrode 24 are connected in series.

Since the top portion electrodes 24A at both ends in the arrangement direction are not connected to the thermoelectric conversion layer and connected to lead wires to the outside, each top portion electrode has a long region in the width direction on the outer side of the top portion a.

The thermoelectric conversion module 10 of the present invention generates power by imparting a temperature difference between the P-type thermoelectric conversion layer 14 and the N-type thermoelectric conversion layer 16 between the top portion a and the bottom portion b of the bellows.

In the thermoelectric conversion module 10 of the present invention, the substrate 12 has flexibility and insulating properties.

In the thermoelectric conversion module 10 of the present invention, various long films (sheet-like materials and plate-like materials) used in known thermoelectric conversion modules using a flexible support can be used for the substrate 12 as long as the film has flexibility and insulating properties.

Specific examples include films of polyester resins such as polyethylene terephthalate, polyethylene isophthalate, polyethylene naphthalate, polybutylene terephthalate, poly (1,4-cyclohexylene dimethylene terephthalate), and polyethylene-2,6-naphthalenedicarboxylate, resins such as polyimide, polycarbonate, polypropylene, polyethersulfone, cycloolefin polymer, and polyether ether ketone (PEEK), triacetyl cellulose (TAC), glass epoxy, and liquid crystal polyester.

Among these, from the viewpoint of thermal conductivity, heat resistance, solvent resistance, ease of availability, and economy, sheet-like materials of polyimide, polyethylene terephthalate, polyethylene naphthalate, and the like are suitably used.

Regarding the thickness of the substrate 12, a thickness makes bellows-like folding possible, allows a bellows-like shape to be maintained, provides sufficient flexibility, and functions as the substrate 12 may be appropriately set according to the size of the thermoelectric conversion module 10, the material for forming the substrate 12, and the like.

The length and the width of the substrate 12 may be appropriately set according to the size and the use of the thermoelectric conversion module 10 and the like.

As the P-type thermoelectric conversion layer 14 and the N-type thermoelectric conversion layer 16, various layers formed of known P-type thermoelectric conversion materials and N-type thermoelectric conversion materials can be used.

As the thermoelectric conversion material constituting the P-type thermoelectric conversion layer 14 and the N-type thermoelectric conversion layer 16, for example, nickel or a nickel alloy may be used.

As the nickel alloy, various nickel alloys that generate power by causing a temperature difference can be used. Specific examples thereof include nickel alloys mixed with one or two or more of vanadium, chromium, silicon, aluminum, titanium, molybdenum, manganese, zinc, tin, copper, cobalt, iron, magnesium, and zirconium.

In a case where nickel or a nickel alloy is used for the P-type thermoelectric conversion layer 14 and the N-type thermoelectric conversion layer 16, the nickel content in the P-type thermoelectric conversion layer 14 and the N-type thermoelectric conversion layer 16 is preferably 90% by atom or more and more preferably 95% by atom or more, and the P-type thermoelectric conversion layer 14 and the N-type thermoelectric conversion layer 16 are particularly preferably formed of nickel. The P-type thermoelectric conversion layer 14 and the N-type thermoelectric conversion layer 16 formed of nickel include inevitable impurities.

As the thermoelectric conversion material for the P-type thermoelectric conversion layer 14, chromel having Ni and Cr as main components is typically used. As the thermoelectric conversion material for the N-type thermoelectric conversion layer 16, constantan having Cu and Ni as main components is typically used.

In addition, in a case where nickel or a nickel alloy is used for the P-type thermoelectric conversion layer 14 and the N-type thermoelectric conversion layer 16 and also nickel or a nickel alloy is used for the bottom portion electrode 20 and the top portion electrode 24, the P-type thermoelectric conversion layer 14, the N-type thermoelectric conversion layer 16, the bottom portion electrode 20, and the top portion electrode 24 may be integrally formed.

As other thermoelectric conversion materials for the P-type thermoelectric conversion layer 14 and the N-type thermoelectric conversion layer 16, for example, the following materials may be used. Incidentally, the components in parentheses indicate the material composition. Examples of the materials include BiTe-based materials (BiTe, SbTe, BiSe and compounds thereof), PbTe-based materials (PbTe, SnTe, AgSbTe, GeTe and compounds thereof), Si—Ge-based materials (Si, Ge, SiGe), silicide-based materials (FeSi, MnSi, CrSi), skutterudite-based materials (compounds represented by $MX_3$ or $RM_4X_{12}$, where M equals Co, Rh, or Ir, X equals As, P, or Sb, and R equals La, Yb, or Ce), transition metal oxides (NaCoO, CaCoO, ZnInO, SrTiO, BiSrCoO, PbSrCoO, CaBiCoO, BaBiCoO), zinc antimony based compounds (ZnSb), boron compounds (CeB, BaB, SrB, CaB, MgB, VB, NiB, CuB, LiB), cluster solids (B cluster, Si cluster, C cluster, AlRe, AlReSi), and zinc oxides (ZnO).

In addition, the film formation method is arbitrary and a film formation method such as a sputtering method, a vapor deposition method, a CVD method, a plating method, or an aerosol deposition method, and a coating method using a coating composition including these materials can be used.

In addition, for the P-type thermoelectric conversion layer 14 and the N-type thermoelectric conversion layer 16, an organic thermoelectric conversion material can also be used. The organic thermoelectric conversion material can be suitably used for the formation of the thermoelectric conversion layer by a coating method using an ink-like or pasty coating composition, such as printing.

Specific examples of the organic thermoelectric conversion material include a conductive polymer and a conductive nanocarbon material.

Examples of the conductive polymer include a polymer compound having a conjugated molecular structure (conjugated polymer). Specific examples thereof include known π-conjugated polymers such as polyaniline, polyphenylene vinylene, polypyrrole, polythiophene, polyfluorene, acetylene, and polyphenylene. Particularly, polydioxythiophene can be suitably used.

Specific examples of the conductive nanocarbon material include carbon nanotubes, carbon nanofiber, graphite, graphene, and carbon nanoparticles. Hereinafter, carbon nanotubes are also referred to as CNTs.

These may be used singly or in combination of two or more thereof. Among these, from the viewpoint of further improving thermoelectric conversion properties, CNT is preferably used.

CNT is categorized into single layer CNT of one graphene sheet (carbon film) wound in the form of a cylinder, double layer CNT of two graphene sheets wound in the form of concentric circles, and multilayer CNT of a plurality of graphene sheets wound in the form of concentric circles. In the present invention, each of the single layer CNT, the double layer CNT, and the multilayer CNT may be used singly, or two or more thereof may be used in combination. Particularly, the single layer CNT and/or the double layer CNT excellent in conductivity and semiconductor characteristics are preferably used, and the single layer CNT is more preferably used.

The single layer CNT may be semiconductive or metallic. Furthermore, semiconductive CNT and metallic CNT may be used in combination. In a case where both of the semiconductive CNT and the metallic CNT are used, a content ratio between the CNTs in a composition may be appropriately adjusted according to the use of the composition. In addition, CNT may contain a metal or the like, and CNT containing fullerene molecules and the like may be used.

An average length of CNT is not particularly limited and may be appropriately selected according to the use of the composition. Specifically, from the viewpoint of ease of manufacturing, film formability, conductivity, and the like, the average length of CNT is preferably 0.01 to 2,000 µm, more preferably 0.1 to 1,000 µm, and particularly preferably 1 to 1,000 µm, though the average length also depends on an inter-electrode distance.

A diameter of CNT is not particularly limited. From the viewpoint of durability, transparency, film formability, conductivity, and the like, the diameter is preferably 0.4 to 100 nm, more preferably 50 nm or less, and particularly preferably 15 nm or less.

Particularly, in a case where the single layer CNT is used, the diameter is preferably 0.5 to 2.2 nm, more preferably 1.0 to 2.2 nm, and particularly preferably 1.5 to 2.0 nm.

The CNT contained in the obtained conductive composition contains defective CNT in some cases. Because the defectiveness of the CNT deteriorates the conductivity of the composition, it is preferable to reduce the amount of the defective CNT. The amount of defectiveness of the CNT in the composition can be estimated by a G/D ratio between a G band and a D band in a Raman spectrum. In a case where the G/D ratio is high, the composition can be assumed to be a CNT material with a small amount of defectiveness. The G/D ratio of the composition is preferably 10 or higher and more preferably 30 or higher.

In addition, modified or treated CNT can also be used. Examples of the modification or treatment method include a method of incorporating a ferrocene derivative or nitrogen-substituted fullerene (azafullerene) into CNT, a method of doping CNT with an alkali metal (potassium or the like) or a metallic element (indium or the like) by an ion doping method, and a method of heating CNT in a vacuum.

In a case where CNT is used, in addition to the single layer CNT or the multilayer CNT, nanocarbons such as carbon nanohorns, carbon nanocoils, carbon nanobeads, graphite, graphene, amorphous carbon, and the like may be contained in the composition.

In a case where CNT is used for the P-type thermoelectric conversion layer 14 and/or the N-type thermoelectric conversion layer 16, it is preferable that the thermoelectric conversion layers include a P-type dopant and an N-type dopant. (P-type Dopant)

Examples of the P-type dopant include halogen (iodine, bromine, or the like), Lewis acid ($PF_5$, $AsF_5$, or the like), protonic acid (hydrochloric acid, sulfuric acid, or the like), transition metal halide ($FeCl_3$, $SnCl_4$, or the like), a metal oxide (molybdenum oxide, vanadium oxide, or the like), and an organic electron-accepting material. Examples of the organic electron-accepting material suitably include a tetracyanoquinodimethane (TCNQ) derivative such as 2,3,5,6-tetrafluoro-7,7,8,8-tetracyanoquinodimethane, 2,5-dimethyl-7,7,8,8-tetracyanoquinodimethane, 2-fluoro-7,7,8,8-tetracyanoquinodimethane, or 2,5-difluoro-7,7,8,8-tetracyanoquinodimethane, a benzoquinone derivative such as 2,3-dichloro-5,6-dicyano-p-benzoquinone or tetrafluoro-1,4-benzoquinone, 5,8H-5,8-bis(dicyanomethylene)quinoxaline, dipyrazino [2,3-f:2',3'-h]quinoxaline-2,3,6,7,10,11-hexacarbonitrile, and the like.

Among these, from the viewpoint of the stability of the materials, the compatibility with CNT, and the like, organic electron-accepting materials such as a tetracyanoquinodimethane (TCNQ) derivative or a benzoquinone derivative is suitably exemplified.

(N-Type Dopant)

As the N-type dopant, known material such as (1) alkali metals such as sodium and potassium, (2) phosphines such as triphenylphosphine and ethylenebis(diphenylphosphine), (3) polymers such as polyvinyl pyrrolidone and polyethylene imine, and the like can be used. In addition, for examples, polyethylene glycol type higher alcohol ethylene oxide adducts, ethylene oxide adducts of phenol, naphthol or the like, fatty acid ethylene oxide adducts, polyhydric alcohol fatty acid ester ethylene oxide adducts, higher alkylamine ethylene oxide adducts, fatty acid amide ethylene oxide adducts, ethylene oxide adducts of fat, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines. Further, acetylene glycol based and acetylene alcohol-based oxyethylene adducts, and fluorine-based and silicon-based surfactants can be also used.

The P-type dopant and the N-type dopant may be used singly or in combination of two or more thereof.

In addition, commercially available products may be used for the P-type dopant and the N-type dopant.

In the thermoelectric conversion module 10, a thermoelectric conversion layer obtained by dispersing the aforementioned thermoelectric conversion material in a resin material (binder) is suitably used.

Among these, the thermoelectric conversion layer obtained by dispersing a conductive nanocarbon material in a resin material is more suitably exemplified. Especially, the thermoelectric conversion layer obtained by dispersing CNT in a resin material is particularly suitably exemplified because this makes it possible to obtain high conductivity and the like.

As the resin material, various known nonconductive resin materials (polymers) can be used.

Specifically, it is possible to use various known resin materials such as a vinyl compound, a (meth)acrylate compound, a carbonate compound, an ester compound, an epoxy compound, a siloxane compound, and gelatin.

More specifically, examples of the vinyl compound include polystyrene, polyvinyl naphthalene, polyvinyl acetate, polyvinyl phenol, and polyvinyl butyral. Examples of the (meth)acrylate compound include polymethyl (meth)acrylate, polyethyl (meth)acrylate, polyphenoxy(poly)ethylene glycol (meth)acrylate, and polybenzyl (meth)acrylate. Examples of the carbonate compound include bisphenol Z-type polycarbonate, and bisphenol C-type polycarbonate. Examples of the ester compound include amorphous polyester.

Polystyrene, polyvinyl butyral, a (meth)acrylate compound, a carbonate compound, and an ester compound are preferable, and polyvinyl butyral, polyphenoxy(poly)ethylene glycol (meth)acrylate, polybenzyl (meth)acrylate, and amorphous polyester are more preferable.

In the thermoelectric conversion layer obtained by dispersing a thermoelectric conversion material in a resin material, a quantitative ratio between the resin material and the thermoelectric conversion material may be appropriately set according to the material used, the thermoelectric conversion efficiency required, the viscosity or solid content concentration of a coating composition exerting an influence on printing, and the like.

As another configuration of the thermoelectric conversion layer in the thermoelectric conversion element, a thermoelectric conversion layer mainly constituted of CNT and a surfactant is also suitably used.

By constituting the thermoelectric conversion layer of CNT and a surfactant, the thermoelectric conversion layer can be formed using a coating composition to which a surfactant is added. Therefore, the thermoelectric conversion layer can be formed using a coating composition in which CNT is smoothly dispersed. As a result, by a thermoelectric conversion layer including a large amount of long and less defective CNT, excellent thermoelectric conversion performance is obtained.

As the surfactant, known surfactants can be used as long as the surfactants function to disperse CNT. More specifically, various surfactants can be used as the surfactant as long as surfactants dissolve in water, a polar solvent, or a mixture of water and a polar solvent and have a group adsorbing CNT.

Accordingly, the surfactant may be ionic or nonionic. Furthermore, the ionic surfactant may be any of cationic, anionic, and amphoteric surfactants.

Examples of the anionic surfactant include an aromatic sulfonic acid-based surfactant such as alkylbenzene sulfonate like dodecylbenzene sulfonate or dodecylphenylether sulfonate, a monosoap-based anionic surfactant, an ether sulfate-based surfactant, a phosphate-based surfactant and a carboxylic acid-based surfactant such as sodium deoxycholate or sodium cholate, and a water-soluble polymer such as carboxymethyl cellulose and a salt thereof (sodium salt, ammonium salt, or the like), a polystyrene sulfonate ammonium salt, or a polystyrene sulfonate sodium salt.

Examples of the cationic surfactant include an alkylamine salt and a quaternary ammonium salt. Examples of the amphoteric surfactant include an alkyl betaine-based surfactant, and an amine oxide-based surfactant.

Further, examples of the nonionic surfactant include a sugar ester-based surfactant such as sorbitan fatty acid ester, a fatty acid ester-based surfactant such as polyoxyethylene-resin acid ester, and an ether-based surfactant such as polyoxyethylene alkyl ether.

Among these, an ionic surfactant is preferably used, and cholate or deoxycholate is particularly suitably used.

In the thermoelectric conversion layer including CNT and the surfactant, a mass ratio of surfactant/CNT is preferably 5 or less, and more preferably 3 or less.

It is preferable that the mass ratio of surfactant/CNT is 5 or less from the viewpoint that a higher thermoelectric conversion performance or the like is obtained.

If necessary, the thermoelectric conversion layer formed by using an organic thermoelectric conversion material may contain an inorganic material such as $SiO_2$, $TiO_2$, $Al_2O_3$, or $ZrO_2$.

In a case where the thermoelectric conversion layer contains an inorganic material, a content of the inorganic material is preferably 20% by mass or less, and more preferably 10% by mass or less.

In the thermoelectric conversion module of the present invention, the thickness of the P-type thermoelectric conversion layer 14 and the N-type thermoelectric conversion layer 16, the size of the thermoelectric conversion layers in a plane direction, the proportion of the area of the thermoelectric conversion layers with respect to the substrate 12 along the plane direction, and the like may be appropriately set according to the material for forming the thermoelectric conversion layers, the size of the thermoelectric conversion module 10, and the like.

Such P-type thermoelectric conversion layer 14 and N-type thermoelectric conversion layer 16 can be prepared by various known methods according to the forming material, such as a coating method or a vacuum film formation method such as vacuum vapor deposition.

For example, a coating method of preparing a coating composition which becomes a thermoelectric conversion layer and performing patterning according to a thermoelectric conversion layer to be formed to apply the coating composition may be used. The application of the coating composition may be performed by a known method such as a method using a mask or a printing method.

After the coating composition is applied, the coating composition is dried by a method according to the resin material, thereby forming the thermoelectric conversion layer. If necessary, after the coating composition is dried, the coating composition (resin material) may be cured by being irradiated with ultraviolet rays or the like.

Alternatively, the prepared coating composition which becomes the thermoelectric conversion layer is applied to the entire surface of the insulating substrate and dried, and then the thermoelectric conversion layer may be formed as a pattern by etching or the like.

Next, in a case where the thermoelectric conversion layer is formed by a coating composition prepared such a manner that CNT and a surfactant are added to water and dispersed (dissolved), it is preferable to form the thermoelectric conversion layer by forming the thermoelectric conversion layer with the coating composition, then immersing the thermoelectric conversion layer in a solvent for dissolving the surfactant or washing the thermoelectric conversion layer with a solvent for dissolving the surfactant, and drying the thermoelectric conversion layer. Thus, it is possible to form the thermoelectric conversion layer having a very small mass ratio of surfactant/CNT by removing the surfactant from the thermoelectric conversion layer and more preferably not containing the surfactant.

Among these, the P-type thermoelectric conversion layer 14 and the N-type thermoelectric conversion layer 16 are preferably formed as a pattern by printing.

As the printing method, various known methods such as screen printing, metal mask printing, and ink jetting can be used. In a case where the thermoelectric conversion layer is formed as a pattern by using a coating composition containing CNT, it is more preferable to use metal mask printing.

The printing conditions may be appropriately set according to the physical properties (such as solid content concentration and viscosity, and viscoelastic properties) of the coating composition used, the opening size of a printing plate, the number of openings, the opening shape, a printing area, and the like.

Specifically, in a case of screen printing, an attack angle of a squeegee is preferably 50° or less, more preferably 40° or less, and particularly preferably 30° or less. As the squeegee, it is possible to use an obliquely polished squeegee, a sword squeegee, a square squeegee, a flat squeegee, a metal squeegee, and the like. The squeegee direction (printing direction) is preferably the same direction as the serial connection direction of the thermoelectric conversion element. A clearance is preferably 0.1 to 3.0 mm and more preferably 0.5 to 2.0 mm. The printing can be performed at a printing pressure of 0.1 to 0.5 MPa in a squeegee indentation amount of 0.1 mm to 3 mm. By performing printing under such conditions, a thermoelectric conversion layer pattern having a film thickness of 1 μm or more, particularly, a CNT-containing thermoelectric conversion layer pattern having a film thickness of 1 μm or more can be suitably formed.

Such P-type thermoelectric conversion layer 14 and N-type thermoelectric conversion layer 16 are formed on each sloped surface of the substrate 12 between the top portions a and the bottom portions b. The P-type thermoelectric conversion layer 14 and the N-type thermoelectric conversion layer 16 adjacent in the arrangement direction are connected in series by the top portion electrode 24 at the top portion a and by the bottom portion electrode 20 at the bottom portion b, respectively.

The material for forming the top portion electrode 24 and the bottom portion electrode 20 is not particularly limited and various materials can be used as long as the material is a conductive material. Specific examples thereof preferably include metal materials such as Al, Cu, Ag, Au, Pt, Cr, Ni, and solder.

The P-type thermoelectric conversion layer 14 and the N-type thermoelectric conversion layer 16 may be electrically connected by making the end portions of the bottom portion electrode 20 and the top portion electrode 24 to abut to each other. However, preferably, the P-type thermoelectric conversion layer 14 and the N-type thermoelectric conversion layer 16 are electrically connected by forming the electrodes such that some parts thereof become the lower layers and/or the upper layers of the P-type thermoelectric conversion layer 14 and the N-type thermoelectric conversion layer 16.

In the example shown in FIGS. 1A and 1B, the top portion electrode 24 and the bottom portion electrode 20 are formed such that some parts thereof become the lower layers of the P-type thermoelectric conversion layer 14 and the N-type thermoelectric conversion layer 16. In FIG. 1B, in order to simplify the drawing, the overlapping of the thermoelectric conversion layers and the electrodes is omitted (the same applies to FIGS. 2B and 4C which will be described later).

The bottom portion electrode 20 and the top portion electrode 24 can be formed by various known methods, such as a coating method such as printing or the like or a vacuum film formation method such as vacuum vapor deposition, according to the material for forming the top portion electrode 24 and the bottom portion electrode 20 as in the formation of the thermoelectric conversion layers. In a case where some parts of the top portion electrode 24 and the bottom portion electrode 20 are formed as the upper layers of the P-type thermoelectric conversion layer 14 and the N-type thermoelectric conversion layer 16, it is preferable to form the top portion electrode 24 and the bottom portion electrode 20 by printing using silver paste or solder paste.

In addition, in the thermoelectric conversion module of the present invention, the thickness of the top portion electrode 24 and the bottom portion electrode 20, the size of the electrodes in a plane direction, the proportion of the area of the electrodes with respect to the substrate 12 along the plane direction, and the like may be appropriately set according to the material for forming the electrodes, the size of the thermoelectric conversion module 10, and the like.

The thermoelectric conversion module 10 of the present invention is generally produced by forming the P-type thermoelectric conversion layer 14 and the N-type thermoelectric conversion layer 16, the top portion electrode 24, and the bottom portion electrode 20 on one surface of the flat plate-like long substrate 12 by patterning, and then folding the substrate 12 in a bellows-like shape.

The P-type thermoelectric conversion layer 14, the N-type thermoelectric conversion layer 16, the top portion electrode 24, and the bottom portion electrode 20 may be formed by a known method according to the forming material, which is as described above.

In addition, the folding of the substrate 12 may also be performed by a known method of folding a sheet-like material in a bellows-like shape such as pressing, or processing by sandwiching transport using a roller having projections formed thereon.

As described above, in the thermoelectric conversion module 10, the substrate 12 is folded in a bellows-like shape to have the top portion a (mountain portion) and the bottom portion b (valley portion) and on one surface of the substrate 12, the P-type thermoelectric conversion layer 14 and the N-type thermoelectric conversion layer 16 are alternately formed on each sloped surface of the substrate 12 between the top portions a and the bottom portions b. In the example shown in the drawing, in a direction from the left to the right of the arrangement direction, the P-type thermoelectric conversion layer 14 is formed on the sloped surface reaching from the top portion a to the bottom portion b, and the N-type thermoelectric conversion layer 16 is formed on the sloped surface reaching from the bottom portion b to the top portion a.

Here, in the thermoelectric conversion module 10 of the present invention, the facing P-type thermoelectric conversion layer 14 and N-type thermoelectric conversion layer 16, that is, the P-type thermoelectric conversion layer 14 and the N-type thermoelectric conversion layer 16 sandwiching the bottom portion b in the arrangement direction are formed such that the layers are not overlapped with each other as viewed from the arrangement direction.

In addition, the P-type thermoelectric conversion layer 14 and the N-type thermoelectric conversion layer 16 are formed without extending over the top portion a and the bottom portion b.

Further, the P-type thermoelectric conversion layer 14 and the N-type thermoelectric conversion layer 16 are electrically connected by the top portion electrode 24 extending over one top portion a on the top portion a side and are electrically connected by the bottom portion electrode 20 extending over one bottom portion b on the bottom portion b side, and the P-type thermoelectric conversion layer 14 and the N-type thermoelectric conversion layer 16 formed on each sloped surface of the substrate 12 are electrically connected in series in the arrangement direction.

Since the thermoelectric conversion module 10 of the present invention has such a configuration, in a state in which the bellows is closed by compressing the substrate 12 in the arrangement direction, it is possible to prevent the P-type thermoelectric conversion layer 14 and the N-type thermoelectric conversion layer 16 from coming into contact with members other than the substrate 12.

As a result, the thermoelectric conversion module 10 of the present invention can highly effectively generates power in a state in which the bellows is closed by adopting such a configuration.

Figure 6A:
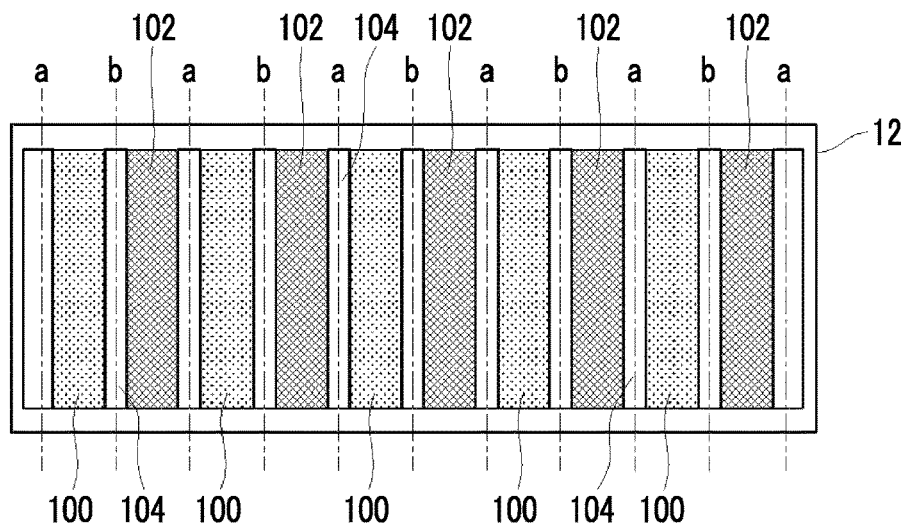
FIG. 6A is a view conceptually showing a state in which a bellows of a thermoelectric conversion module of the related art is opened.

In a bellows-like thermoelectric conversion module of the related art, as an example, as conceptually shown in FIG. 6A, at folding lines (dashed line a and dashed line b) set at fixed intervals, a P-type thermoelectric conversion layer 100 and an N-type thermoelectric conversion layer 102 are alternately formed between the lines, and the adjacent P-type thermoelectric conversion layer 100 and N-type thermoelectric conversion layer 102 are connected with a connection electrode 104 extending over the top portion a or the bottom portion b to connect the alternately arranged P-type thermoelectric conversion layer 100 and N-type thermoelectric conversion layer 102 in series.

Figure 6B:
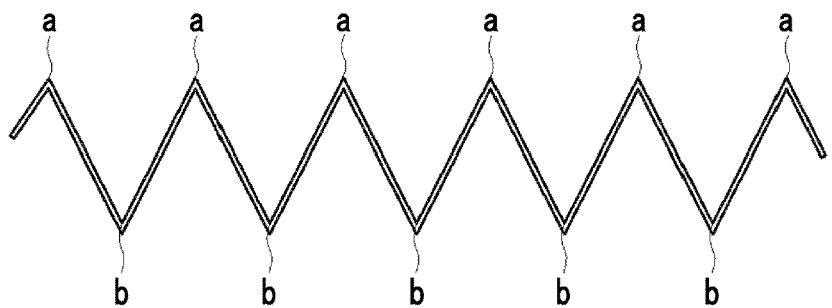
FIG. 6B is a view conceptually showing the thermoelectric conversion module of the related art.

Such a thermoelectric conversion module is formed in a bellows-like shape folded at the top portion a and the bottom portion b by alternately performing mountain folding and valley folding at the folding line, as conceptually shown in FIG. 6B. As disclosed in JP2005-328000A and WO2013/114854A, in the bellows-like thermoelectric conversion modules of the related art, the closing of the bellows by compressing the bellows is not considered, and adjacent, that is, facing sloped surfaces of the substrate 12, that is, the P-type thermoelectric conversion layer 100 and the N-type thermoelectric conversion layer 102 are completely separated as conceptually shown in FIG. 6B.

However, for the thermoelectric conversion module in which the thermoelectric conversion layers are formed on the sloped surfaces by folding the substrate in a bellows-like shape, from the viewpoint of being capable of reducing the size, improving the heat transfer efficiency, improving the mounting density of the thermoelectric conversion element, and the like, a state in which the bellows is closed by compressing the substrate in the arrangement direction, that is, a state in which the bellows is completely folded is advantageous.

Figure 6C:
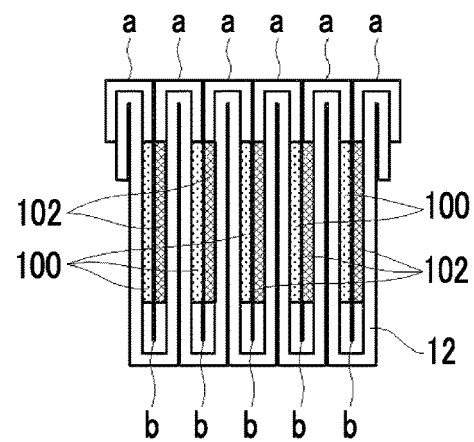
FIG. 6C is a view conceptually showing the thermoelectric conversion module of the related art.

However, in the thermoelectric conversion module of the related art, in a case where the bellows is closed, as conceptually shown in FIG. 6C, the facing P-type thermoelectric conversion layer 100 and N-type thermoelectric conversion layer 102 come into contact with each other to cause a short circuit and thus power is not generated. Further, in the configuration shown in FIG. 6C, adjacent connection electrodes on the top portion a side come into contact with each other to cause a short circuit.

Such a short circuit can be solved by covering the facing P-type thermoelectric conversion layer 100 and N-type thermoelectric conversion layer 102 with an insulating layer. However, in consideration of heat transfer efficiency, that is, power generation efficiency in the thermoelectric conversion module, it is preferable that an unnecessary member which has an influence on heat transfer in the thermoelectric conversion layer is not brought into contact with the thermoelectric conversion layer.

In contrast, the thermoelectric conversion module 10 of the present invention has a configuration in which the P-type thermoelectric conversion layer 14 and the N-type thermoelectric conversion layer 16 do not extend over the top portion a and the bottom portion b and the P-type thermoelectric conversion layer 14 and the N-type thermoelectric conversion layer 16 which faces to each other while sandwiching the bottom portion b are not overlapped with each other as viewed from the arrangement direction, and further, the adjacent P-type thermoelectric conversion layer 14 and N-type thermoelectric conversion layer 16 are connected by the top portion electrode 24 over one top portion a and by the bottom portion electrode 20 over one bottom portion b.

Therefore, as shown in FIG. 1B, the thermoelectric conversion module 10 of the present invention is capable of preventing the facing P-type thermoelectric conversion layer 14 and N-type thermoelectric conversion layer 16 from coming into contact with each other even in a state in which the bellows is closed. Further, the P-type thermoelectric conversion layer 14 and the N-type thermoelectric conversion layer 16 can be prevented from coming into contact with the unconnected top portion electrode 24 and bottom portion electrode 20.

Accordingly, according to the present invention, even in a state in which the bellows is closed, that is, even in a state the bellows is completely folded, the bellows-like thermoelectric conversion module is capable of preventing the P-type thermoelectric conversion layer 14 and the N-type thermoelectric conversion layer 16 from coming into contact with members other than the substrate 12.

Therefore, according to the present invention, highly effective power generation can be performed with high heat transfer efficiency by the thermoelectric conversion module which is compact in a state in which the bellows is closed and has a high mounting density of the thermoelectric conversion element.

Here, a preferable embodiment of the thermoelectric conversion module 10 shown in FIGS. 1A and 1B is configured such that the external end portions of the P-type thermoelectric conversion layer 14 and the N-type thermoelectric conversion layer 16 in the width direction are set at fixed positions, the size of one of the thermoelectric conversion layers in the width direction is gradually increased, and the size of the other in the width direction is gradually decreased in the arrangement direction. In the example shown in the drawing, in a direction from the left to the right in the drawing in the arrangement direction, the size of the P-type thermoelectric conversion layer 14 in the width direction is gradually increased and the size of the N-type thermoelectric conversion layer 16 in the width direction is gradually decreased.

In addition, the P-type thermoelectric conversion layer 14 and the N-type thermoelectric conversion layer 16 which are connected with the top portion electrode 24 are formed to be separate from each other in the width direction and the top portion electrode 24 is provided between P-type thermoelectric conversion layer 14 and the N-type thermoelectric conversion layer 16 to be connected in the width direction.

Accordingly, the position of the top portion electrode 24 in the width direction is gradually moved in the arrangement direction. In the example shown in the drawing, the position of the top portion electrode 24 in the width direction is gradually moved in a direction from the left to the right in the drawing in the arrangement direction, that is, upward in FIG. 1A.

Further, the top portion electrodes 24 adjacent to each other in the arrangement direction has a shape in which the portions which face each other in the arrangement direction while sandwiching the bottom portion b are not overlapped with each other as viewed in the arrangement direction.

Figure 1D:
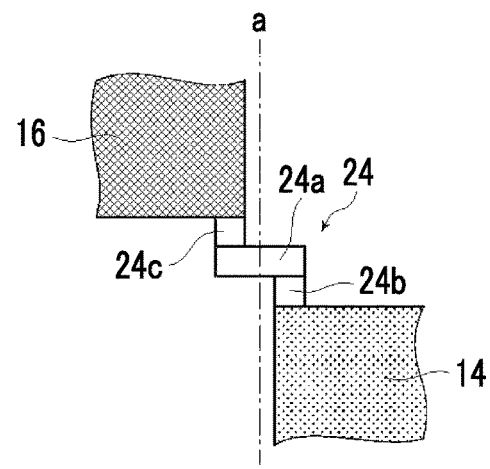
FIG. 1D is a view conceptually showing an example of a top portion electrode.

In the example shown in the drawing, as conceptually shown in FIG. 1D, the top portion electrode 24 includes a main body portion 24a, a first connection portion 24b, a second connection portion 24c. These may be integrally formed or may be formed individually through electrical connection. The main body portion 24a has a shape extending over the top portion a. The first connection portion 24b connects the main body portion 24a and the P-type thermoelectric conversion layer 14 between the main body portion 24a and the P-type thermoelectric conversion layer 14 without extending over the top portion a. The second connection portion 24c connects the main body portion 24a and the N-type thermoelectric conversion layer 16 between the main body portion 24a and the N-type thermoelectric conversion layer 16 without extending over the top portion a. Further, the main body portions 24a of the top portion electrodes 24 adjacent to each other in the arrangement direction out of the top portion electrodes 24 are not overlapped with each other as viewed in the arrangement direction.

Therefore, the thermoelectric conversion module 10 shown in FIGS. 1A and 1B is capable of preventing the top portion electrodes 24 adjacent to each other in the arrangement direction as shown in FIG. 1B from coming into contact with each other to cause a short circuit even in a case where the bellows is closed.

In addition, by fixing the position of the end portion separated in the width direction and gradually increasing and decreasing the size of the P-type thermoelectric conversion layer 14 and the size of the N-type thermoelectric conversion layer 16 in the width direction, while the top portion electrodes 24 adjacent to each other in the arrangement direction come contact with each other, the size of the P-type thermoelectric conversion layer 14 and the size of the N-type thermoelectric conversion layer 16 can be increased by utilizing the sloped surface of the substrate 12 as much as possible.

Figure 2A:
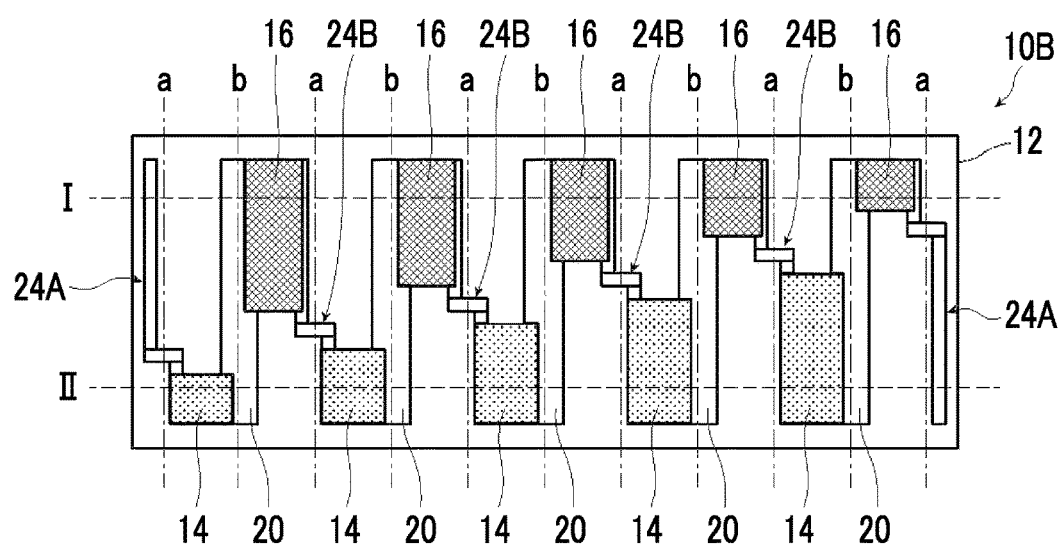
FIG. 2A is a view conceptually showing a state in which a bellows of another example of the thermoelectric conversion module of the present invention is opened.
Figure 2B:
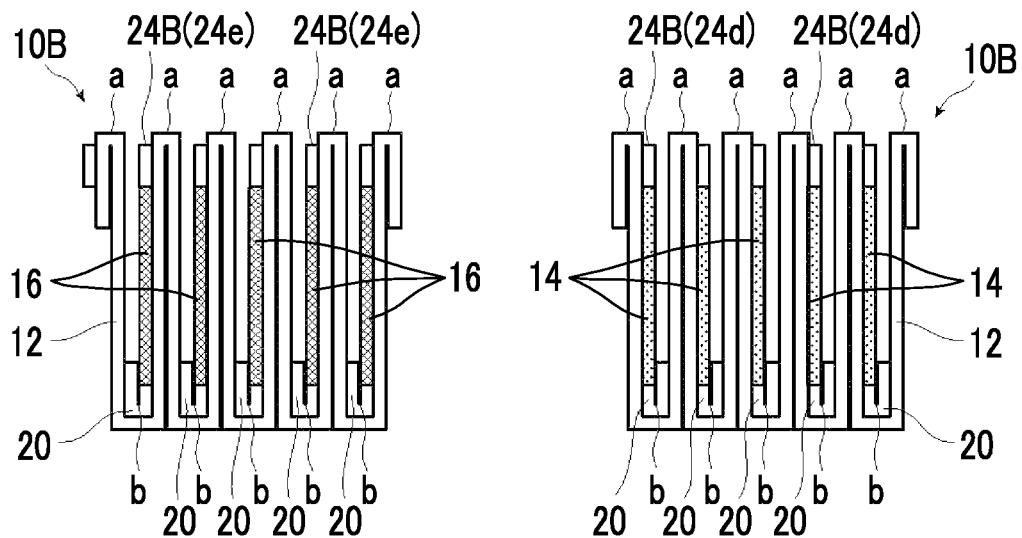
FIG. 2B is a view conceptually showing the other example of the thermoelectric conversion module of the present invention.
Figure 2C:
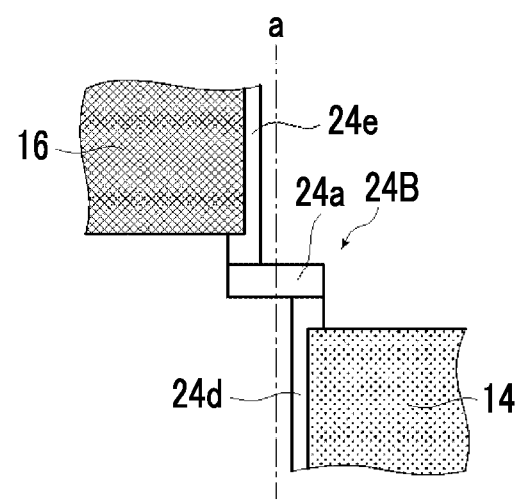
FIG. 2C is a view conceptually showing another example of a top portion electrode.

In FIGS. 2A to 2C, an example of a thermoelectric conversion module having a top portion electrode a different configuration is shown. FIG. 2A corresponds to FIG. 1A, FIG. 2B corresponds to FIG. 1B, and FIG. 2C corresponds to FIG. 1D, respectively.

A top portion electrode 24B of the thermoelectric conversion module 10B shown in FIG. 2A is configured to include a main body portion 24a, a first connection portion 24d which connects the main body portion 24a and the P-type thermoelectric conversion layer 14, and a second connection portion 24e which connects the main body portion 24a and the N-type thermoelectric conversion layer 16.

In the top portion electrode 24B of the thermoelectric conversion module 10B shown in FIGS. 2A to 2C, the main body portion 24a is the same as the top portion electrode 24 shown in FIGS. 1A, 1D, and the like.

Here, in the top portion electrode 24 shown in FIGS. 1A, 1D, and the like, the first connection portion 24b and the second connection portion 24c connect the main body portion 24a and the corresponding thermoelectric conversion layers without extending over the top portion a between the main body portion 24a and the corresponding thermoelectric conversion layers.

In contrast, in the top portion electrode 24B shown in FIGS. 2A to 2C, the first connection portion 24d which connects the main body portion 24a and the P-type thermoelectric conversion layer 14 has a shape which does not extend over the top portion a and is long in the same direction as the direction of the folding line of the top portion a, and comes into contact with the entire region of the end portion of the P-type thermoelectric conversion layer 14 on the top portion a side in the width direction. In addition, the second connection portion 24e which connects the main body portion 24a and the N-type thermoelectric conversion layer 16 also has a shape which does not extend over the top portion a and is long in the same direction as the direction of the folding line of the top portion a, and comes into contact with the entire region of the end portion of the N-type thermoelectric conversion layer 16 on the top portion a side in the width direction.

Even in the configuration, in the top portion electrodes 24B adjacent to each other in the arrangement direction, the main body portions 24a extending over the top portions a are overlapped with each other as viewed in the arrangement direction, and the first connection portion 24d and the second connection portion 24e which connect the main body portion 24a and the corresponding thermoelectric conversion layers do not extend over the top portion a.

Therefore, as shown in FIG. 2B, even in a case where the bellows of the thermoelectric conversion module 10B is closed, the top portion electrodes 24B adjacent to each other in the arrangement direction can be prevented from coming into contact with each other to cause a short circuit.

The top portion electrode 24 shown in FIG. 1A or the like is advantageous in that a thermoelectric conversion layer having a large area can be formed by utilizing the sloped surface of the substrate 12 as much as possible. On the other hand, the top portion electrode 24B shown in FIG. 2A or the like is advantageous in that since a contact area between the thermoelectric conversion layer and the top portion electrode can be increased, the electric resistance of connection of the thermoelectric conversion layer and the top portion electrode 24B is reduced and the connection can be more stabilized and reliably strengthened.

Accordingly, which configuration is selected may be appropriately determined depending on the size of the thermoelectric conversion module, the durability and mechanical strength required for the thermoelectric conversion module, the desired power generation capacity, adhesiveness between the thermoelectric conversion layer and the top portion electrode, and the like.

In addition, according to the properties required for the thermoelectric conversion module, the first connection portion may adopt the configuration of the top portion electrode 24 or the configuration of the top portion electrode 24B, and the second connection portion may adopt the other configuration.

Regarding the degree of gradual increase and gradual decrease of the P-type thermoelectric conversion layer 14 and the N-type thermoelectric conversion layer 16, the amount of separation between the N-type thermoelectric conversion layer 16 and the P-type thermoelectric conversion layer 14 connected to the top portion electrode 24 in the width direction, the shape of the top portion electrode 24, and the like, a shape in which the top portion electrodes 24 adjacent to each other in the arrangement direction do not come into contact with each other in a case where the bellows of the thermoelectric conversion module 10 is closed, and the like may be appropriately set.

In the example shown in FIG. 1A, in a direction from the left to the right in the drawing, the size of the P-type thermoelectric conversion layer 14 in the width direction is gradually increased and the size of the N-type thermoelectric conversion layer 16 in the width direction is gradually decreased. However, in the present invention, in contrast, the size of the P-type thermoelectric conversion layer 14 in the width direction may be gradually decreased and the size of the N-type thermoelectric conversion layer 16 in the width direction may be gradually increased in the same direction.

As shown in FIG. 1A, in the thermoelectric conversion module 10, the bottom portion electrode 20 extending over the bottom portion b has a shape long in the same direction as the direction of the folding line of the bottom portion b and comes into contact with the entire region of the end portions of the P-type thermoelectric conversion layer 14 and the N-type thermoelectric conversion layer 16 on the bottom portion b side in the width direction.

As described above, the bottom portion electrode 20 is preferably formed of a metal material. Therefore, by forming the bottom portion electrode 20 in a shape which extends over the bottom portion b and is long in the same direction as the direction of the folding line of the bottom portion b, the folding at the bottom portion b can be more reliably maintained by the bottom portion electrode 20 and the bellows-like shape of the thermoelectric conversion module 10 can be more suitably maintained. Further, in the thermoelectric conversion module 10, temperature unevenness on the bottom portion electrode 20 side in the width direction is eliminated, and thus, power generation efficiency can be improved.

Preferably, a broken cut line (perforation) matching with the folding line of the substrate 12 is formed on the bottom portion electrode 20. Due to the broken cut lines, the substrate 12 can be more appropriately folded in a bellows-like shape.

In the thermoelectric conversion module 10 shown in FIG. 1A, the shape of the bottom portion electrode 20 is not limited to the shape in the example of the drawing and as long as the bottom portion electrode can connect the P-type thermoelectric conversion layer 14 and the N-type thermoelectric conversion layer 16, various shapes can be used.

As described above, each thermoelectric conversion module shown in FIGS. 1A, 1B, 2A, and 2B, in the direction from the left to the right in the drawing in the arrangement direction, the size of the P-type thermoelectric conversion layer 14 in the width direction is gradually increased and the size of the N-type thermoelectric conversion layer 16 in the width direction is gradually decreased. Accordingly, as the number of thermoelectric conversion layers (thermoelectric conversion elements) to be arranged increases, finally, the P-type thermoelectric conversion layer 14 and the N-type thermoelectric conversion layer 16 having an appropriate size cannot be formed.

Therefore, in the present invention, as in a thermoelectric conversion module 30 shown in FIG. 3, it is preferable to provide a reset portion 32 which does not have thermoelectric conversion layers and only has a connection electrode 34 that connects the N-type thermoelectric conversion layer 16 and the P-type thermoelectric conversion layer 14 positioned on both sides in the arrangement direction on the facing sloped surfaces in the middle of the arrangement direction.

By providing such a reset portion 32 only having the connection electrode 34 in the middle of the arrangement of the thermoelectric conversion layers of the P-type thermoelectric conversion layer 14 whose size in the width direction is gradually increased and the N-type thermoelectric conversion layer 16 whose size in the width direction is gradually decreased, in the arrangement direction, one top portion electrode 24 which connects the N-type thermoelectric conversion layer 16 and the P-type thermoelectric conversion layer 14 can be removed.

Therefore, in the direction from the left to the right in the drawing in the arrangement direction, the P-type thermoelectric conversion layer 14 and the N-type thermoelectric conversion layer 16 to be formed next to the reset portion 32 can be formed in an arbitrary size.

Accordingly, by providing such a reset portion 32 in the middle of the arrangement direction, for example, as shown in FIG. 3, the state of the P-type thermoelectric conversion layer 14 and the N-type thermoelectric conversion layer 16 to be formed next to the reset portion 32 can be returned to the leftmost state in the drawing, that is, the initial position of the size of the thermoelectric conversion layer. In other words, by providing such a reset portion 32 in the middle of the arrangement direction, the position of the top portion electrode 24 in the width direction to be formed next to the reset portion 32 can be returned to the initial position.

Accordingly, in the thermoelectric conversion module 30 shown in FIG. 3, a relationship in size in the width direction between the P-type thermoelectric conversion layer 14 and the N-type thermoelectric conversion layer 16 to be formed on the facing sloped surfaces on both sides of the reset portion 32 in the arrangement direction is mutually reversed.

By adopting such a configuration, for example, as shown in FIG. 3, as in a configuration in which a plurality of thermoelectric conversion modules 10 (two thermoelectric conversion modules in FIG. 3) shown in FIG. 1A or the like are formed in a repeated manner in the arrangement direction and are connected by the reset portion 32, and the like, a large number of thermoelectric conversion elements can be connected. Therefore, by forming the reset portion 32 in which only the connection electrode 34 is provided on the facing sloped surfaces, a thermoelectric conversion module in which a large number of thermoelectric conversion elements are formed and connected on one long substrate and a large power generation capacity can be obtained can be realized.

In the thermoelectric conversion module of the present invention, the reset portion 32 may be provided periodically or non-periodically in the arrangement direction.

It is advantageous to periodically provide the reset portion 32 from the viewpoint of productivity or the like since a thermoelectric conversion module in which a large number of thermoelectric conversion elements are connected in series can be prepared by forming thermoelectric conversion modules having the same configuration in a repeated manner in the arrangement direction and connecting the thermoelectric conversion modules by the reset portion 32 as in the thermoelectric conversion module 30 shown in FIG. 3.

The connection electrode 34 may be formed of the same material as the material of the above-described top portion electrode 24 or the like in the same manner. In addition, the shape of the connection electrode 34 of the reset portion 32 may be a shape that can electrically connect adjacent N-type thermoelectric conversion layer 16 and P-type thermoelectric conversion layer 14.

Here, in the thermoelectric conversion module 30 shown in FIG. 3, the connection electrode 34 of the reset portion 32 has a region 34a which extends over the bottom portion b and is long in the same direction as the direction of the folding line of the bottom portion b.

Since the connection electrode 34 has a long region which extends over the bottom portion b, as in the above-described bottom portion electrode 20, the folding of the bottom portion b in the reset portion 32 can be more suitably maintained by the connection electrode 34.

Preferably, a broken cut line matching with the folding line of the substrate 12 is formed in the long region 34a. Due to the broken cut lines, the substrate 12 in the reset portion 32 can be more suitably folded in a bellows-like shape.

In the example shown in FIG. 3, in the direction from the left to the right in the drawing in the arrangement direction, the state of the P-type thermoelectric conversion layer 14 and the N-type thermoelectric conversion layer 16 to be formed next to the reset portion 32 is returned to the initial state on the leftmost side, but the present invention is not limited thereto. For example, a configuration in which, in the direction from the left to the right in the drawing, next to the reset portion 32, the size of the P-type thermoelectric conversion layer 14 in the width direction whose size has been increased is gradually decreased and the size of the N-type thermoelectric conversion layer 16 in the width direction whose size has been decreased is gradually increased reversely can be used.

Figure 4A:
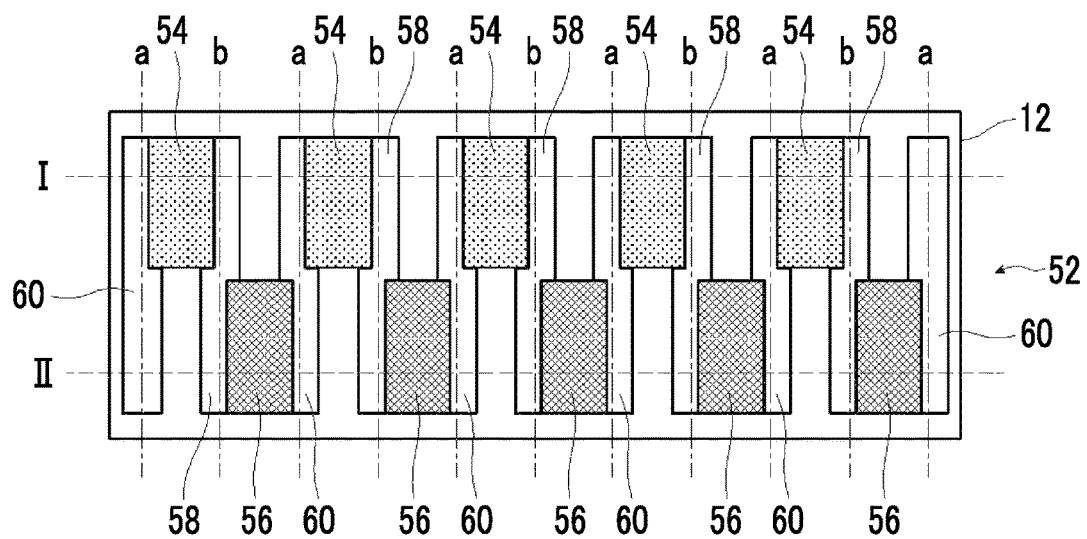
FIG. 4A is a view conceptually showing a state in which a bellows of a module main body of still another example of the thermoelectric conversion module of the present invention is opened.
Figure 4B:
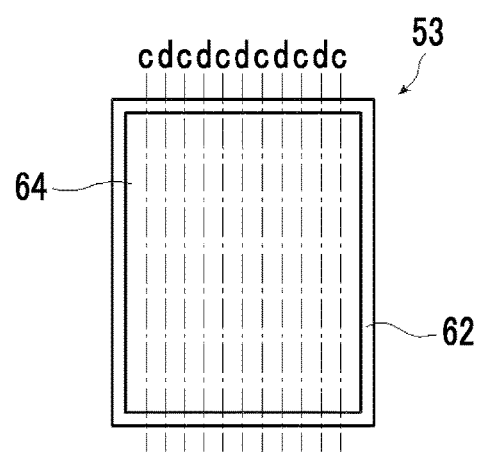
FIG. 4B is a view conceptually showing a state in which a bellows of an insulating member of the other example of the thermoelectric conversion module of the present invention is opened.
Figure 4C:
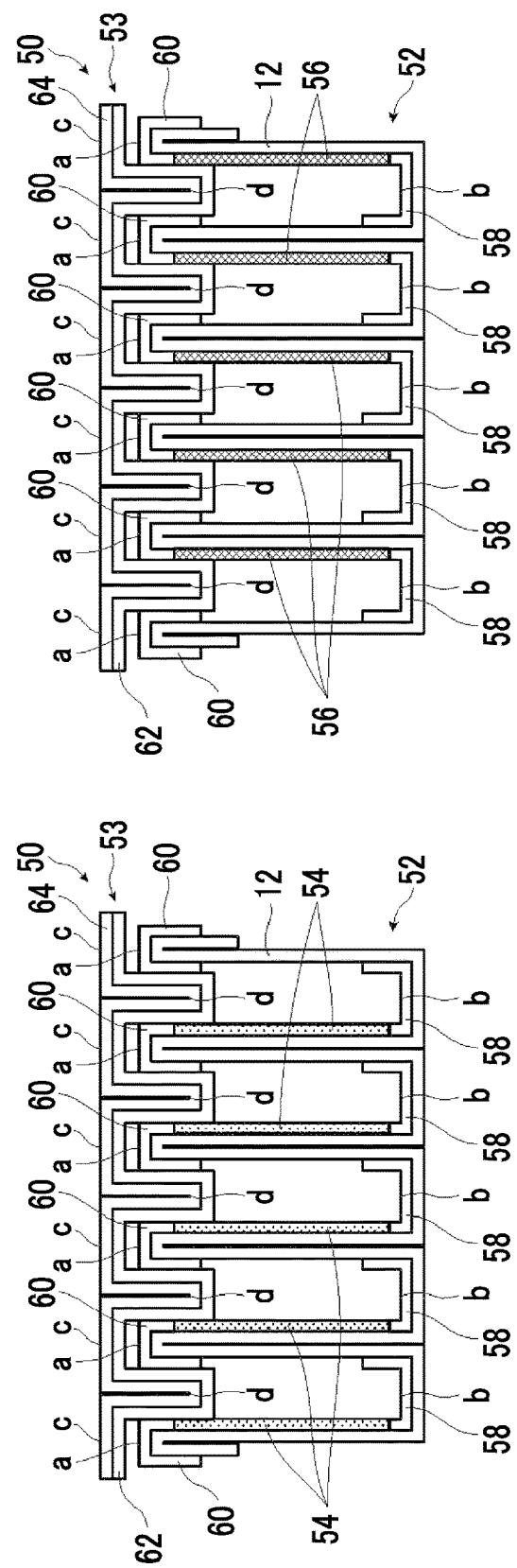
FIG. 4C is a view conceptually showing the other example of the thermoelectric conversion module of the present invention.

In FIG. 4C, still another example of the thermoelectric conversion module of the present invention is conceptually shown.

A thermoelectric conversion module 50 of the present invention shown in FIG. 4C is configured such that a module main body 52 as conceptually shown in FIG. 4A and an insulating member 53 as conceptually shown in FIG. 4B are combined. FIG. 4A shows a state in which the bellows of the module main body 52 is opened in a plane shape and FIG. 4B shows a state in which the bellows of the insulating member 53 is opened in a plane shape.

In addition, as in FIG. 1B, the left side in FIG. 4C is a view showing the thermoelectric conversion module 50 as viewed from the upper side in FIG. 4A at a position indicated by a broken line I in FIG. 4A. The right side in FIG. 4C is a view showing the thermoelectric conversion module 10 as viewed from the lower side in FIG. 4A at a position indicated by a broken line II in FIG. 4A.

The module main body 52 has a substrate 12, a P-type thermoelectric conversion layer 54, an N-type thermoelectric conversion layer 56, a bottom portion electrode 58, and a top portion electrode 60 as in the thermoelectric conversion module 10 shown in FIG. 1A or the like.

As in the thermoelectric conversion module 10, the substrate 12 of the module main body 52 is alternately mountain-folded and valley-folded at positions (at dashed lines) at equal intervals in the arrangement direction to be folded in a bellows-like shape having top portions a (mountain portions) and bottom portions b (valley portions).

The P-type thermoelectric conversion layer 54 and the N-type thermoelectric conversion layer 56 are alternately provided on each sloped surface of the substrate 12 between the top portions a and the bottom portions b. In the module main body 52, in a direction from the left to the right in the drawing in the arrangement direction, the P-type thermoelectric conversion layer 54 is provided on the sloped surface directed from the top portion a to the bottom portion b, and the N-type thermoelectric conversion layer 56 is provided on the sloped surface directed from the bottom portion b to the top portion a.

Further, on the substrate 12, the bottom portion electrode 58 which connects the P-type thermoelectric conversion layer 54 and the N-type thermoelectric conversion layer 56 over one bottom portion b is formed and the top portion electrode 60 which connects the N-type thermoelectric conversion layer 56 and the P-type thermoelectric conversion layer 54 over one top portion a is formed. Thus, the P-type thermoelectric conversion layer 54 and the N-type thermoelectric conversion layer 56 alternately formed in the arrangement direction are connected in series.

As described above, in the present invention, the P-type thermoelectric conversion layer 54 and the N-type thermoelectric conversion layer 56 do not extend over the top portion a and the bottom portion b and the P-type thermoelectric conversion layer 54 and the N-type thermoelectric conversion layer 56 which faces to each other while sandwiching the bottom portion b are not overlapped with each other as viewed from the arrangement direction.

Here, the thermoelectric conversion module 10 shown in FIG. 1A or the like has a configuration in which the size of one of the P-type thermoelectric conversion layer 14 and the N-type thermoelectric conversion layer 16 in the width direction is gradually increased and the size of the other is gradually decreased in the arrangement direction.

In contrast, in the module main body 52 of the thermoelectric conversion module 50, as shown in FIG. 4A, the P-type thermoelectric conversion layer 54 and the N-type thermoelectric conversion layer 56 has the same size and the same shape, are separated from each other in the width direction, and are arranged at positions symmetrical in the width direction with respect to the center in the width direction.

In addition, the bottom portion electrode 58 has a shape which extends over one bottom portion b and is long in the same direction as the direction of the folding line of the bottom portion b, that is, in the width direction like the above-described bottom portion electrode 20. The bottom portion electrode 58 is connected to the entire region in the width direction of the end portions of the P-type thermoelectric conversion layer 54 and the N-type thermoelectric conversion layer 56 on the bottom portion b side in the arrangement direction and electrically connects the P-type thermoelectric conversion layer 54 and the N-type thermoelectric conversion layer 56.

In the module main body 52, similarly, the top portion electrode 60 also has a shape which extends over one top portion a and is long in the same direction as the direction of the folding line of the top portion a, that is, in the width direction. The top portion electrode 60 is connected to the entire region in the width direction of the end portions of the P-type thermoelectric conversion layer 54 and the N-type thermoelectric conversion layer 56 on the top portion a side in the arrangement direction and electrically connects the P-type thermoelectric conversion layer 54 and the N-type thermoelectric conversion layer 56.

Accordingly, for the same reason for the bottom portion electrode 20, the bellows-like shape of the module main body 52 can be suitably maintained and temperature unevenness in the width direction on both the top portion electrode 60 side and the bottom portion electrode 58 side can be eliminated. Thus, power generation efficiency can be improved.

In the thermoelectric conversion module 50 shown in FIGS. 4A to 4C, the shape of the bottom portion electrode 58 and the top portion electrode 60 is not particularly limited to the example shown in the drawings and as long as adjacent P-type thermoelectric conversion layer 54 and N-type thermoelectric conversion layer 56 can be electrically connected, various shapes can be used.

Preferably, in the top portion electrode 60, a broken cut line (perforation) matching with the folding line of the substrate 12 is also formed. Due to the broken cut lines, the substrate 12 can be more appropriately folded in a bellows-like shape.

On the other hand, the insulating member 53 is formed by providing a thermal conductive layer 64 on one surface of an insulating sheet 62.

The insulating sheet 62 is the same film as the substrate 12.

The thermal conductive layer 64 is a layer formed of a material having high thermal conductivity. Examples of materials for forming the thermal conductive layer 64 include various metal materials, inorganic compounds such as alumina, boron nitride, and aluminum nitride, and carbon materials such as graphite. Among these, metal materials such as copper are suitably used.

The insulating member 53 is also alternately mountain-folded and valley-folded at folding lines (dashed lines) set at equal intervals in the arrangement direction of the module main body 52 to be folded in a bellows-like shape having top portions c (mountain portions) and bottom portions d (valley portions).

Although described later, the insulating member 53 may correspond to only the top portion electrode 60 of the module main body 52, and thus, compared to the module main body 52, the interval between the folding lines (dashed lines) may be narrowed and may be short in length in the arrangement direction as the module is spread in a plane shape.

The insulating member 53 may be basically prepared in the same manner as in the preparation of the thermoelectric conversion module except that the thermoelectric conversion layer is not provided.

As shown in FIG. 4C, the thermoelectric conversion module 50 is formed by inserting the bottom portion d side of the insulating member 53 between the top portions a of the module main body 52 while directing the insulating sheet 62 side to the module main body 52 and laminating the module main body 52 and the insulating member 53.

As described above, in the present invention, the P-type thermoelectric conversion layer 54 and the N-type thermoelectric conversion layer 56 which face each other while sandwiching the bottom portion b are formed not to be overlapped with each other as viewed in the arrangement direction. In the module main body 52, the P-type thermoelectric conversion layer 54 and the N-type thermoelectric conversion layer 56 have the same size and the same shape, are separated from each other in the width direction, and are formed at positions symmetrical in the width direction with respect to the center in the width direction.

Accordingly, as shown in FIG. 4C, even in a case where the module main body 52 is compressed in the arrangement direction and the bellows is closed, the P-type thermoelectric conversion layer 54 and the N-type thermoelectric conversion layer 56 which face each other while sandwiching the bottom portion b do not come into contact with each other.

On the other hand, in the module main body 52, the top portion electrode 60 is long in the width direction and is connected to the entire region of the end portions of the P-type thermoelectric conversion layer 54 and the N-type thermoelectric conversion layer 56 on the top portion side in the width direction. Therefore, in a case where the module main body 52 is compressed in the arrangement direction and the bellows is closed, the top portion electrodes 60 adjacent to each other in the arrangement direction a come into contact with each other to cause a short circuit.

In contrast, the thermoelectric conversion module 50 shown in FIG. 4C has a configuration in which the module main body 52 and the insulating member 53 are laminated by using the insulating member 53 having the thermal conductive layer 64 formed on the insulating sheet 62 and folded in a bellows-like shape, and while directing the insulating sheet 62 side to the module main body 52, inserting the bottom portion d side of the insulating member 53 between the top portions a of the module main body 52.

Therefore, even in a case where the thermoelectric conversion module 50 is compressed in the arrangement direction and the bellows is closed, the top portion electrode 60 is covered by the insulating sheet 62 of the insulating member 53, and thus, it is possible to prevent the top portion electrodes 60 adjacent to each other in the arrangement direction from coming into contact with each other to cause a short circuit.

Accordingly, in a case where the insulating member 53 is laminated on the module main body 52, it is necessary to set the depth of the bottom portion d, that is, the pitch of the bellows-like folds, the length in the arrangement direction, the size of the insulating sheet 62 in the width direction, and the like so as to completely cover the top portion electrode 60 by the insulating member 53 which becomes the bottom portion d.

In addition, in the insulating member 53, from the viewpoint of heat transfer efficiency and the like, it is preferable that the contact amount between the P-type thermoelectric conversion layer 54 and the N-type thermoelectric conversion layer 56 is small. Thus, it is preferable that the depth of the bottom portion d, the length in the arrangement direction, and the like are set in consideration of this point. Alternatively, the contact amount between the insulating member 53 and the thermoelectric conversion layer may be adjusted by adjusting the insertion amount of the insulating member 53 into the module main body 52.

In the present invention, the insulating member is not particularly limited to a configuration in which the thermal conductive layer 64 is formed on the insulating sheet 62. For example, only the insulating sheet 62 folded in a bellows-like shape may be used as an insulating member. Alternatively, an insulating layer formed of a resin material or the like formed by covering a portion from which the surface of the top portion electrode 60 is exposed is maybe used as an insulating member.

Here, as described above, the thermal conductive layer 64 is preferably formed of a metal material. Therefore, as shown in the example in the drawing, according to the insulating member 53 in which the thermal conductive layer 64 is formed on the insulating sheet 62, due to the action of the thermal conductive layer 64, the bellows-like shape can be more suitably maintained. Further, since the insulating member has the thermal conductive layer 64, temperature unevenness is not caused in the entire region of the insulating member 53 in the plane direction and effective power generation can be performed.

Preferably, the thermal conductive layer 64 has the broken cut line at the position corresponding to the folding line of the insulating member 53, and thus, the insulating member 53 can be appropriately folded in a bellows-like shape.

As described above, it is preferable to use the thermoelectric conversion module of the present invention a state in which the bellows is closed, that is, a state in which the bellows is completely folded by compressing the thermoelectric conversion module in the arrangement direction. Accordingly, it is preferable to set the thermoelectric conversion module to be in a state in which the bellows is closed by compressing the thermoelectric conversion module in the arrangement direction by using the compression member.

For the compression member which compresses the thermoelectric conversion module to close the bellows, known various members used for closing a bellows-like material can be used. Examples thereof include a zig which presses the thermoelectric conversion module in the arrangement direction while sandwiching the thermoelectric conversion module therebetween, an energizing member, such as a spring or rubber, which presses the thermoelectric conversion module in the arrangement direction, a frame into which the thermoelectric conversion module in a state in which the bellows is closed is inserted, and a fastening member such as a wire.

Figure 5:
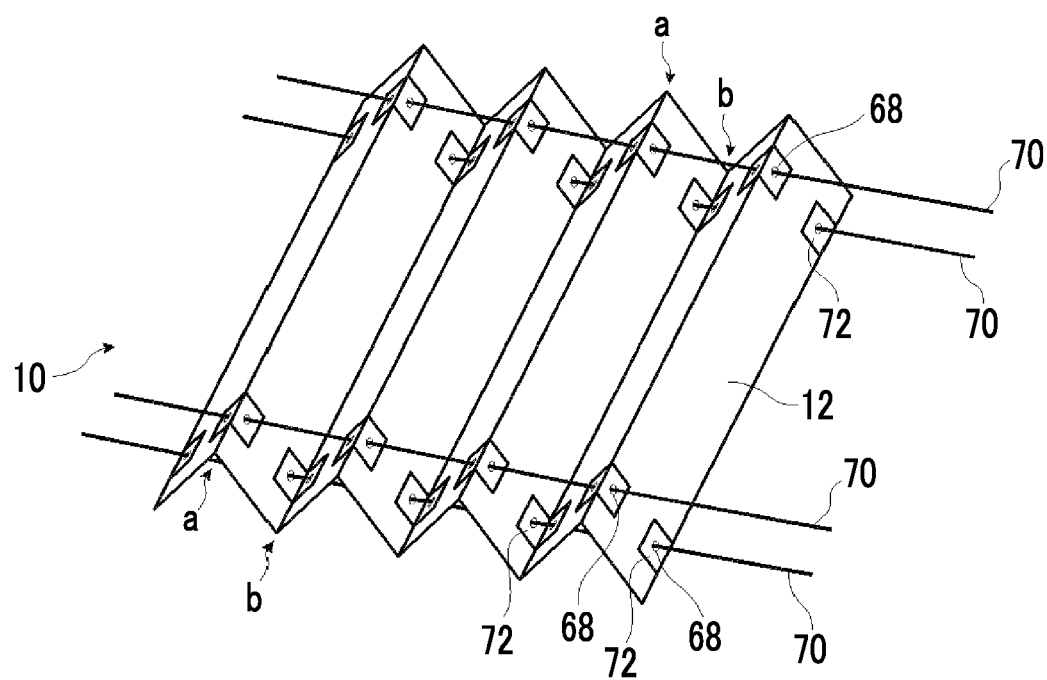
FIG. 5 is a view conceptually showing an example of a method of closing the bellows of the thermoelectric conversion module of the present invention.

As a suitable example, the thermoelectric conversion module 10 shown in FIG. 5 is conceptually shown and a method using a through hole and a wire as compression members is exemplified. In FIG. 5, in order to clearly show the configuration in which the thermoelectric conversion module 10 is compressed and the bellows is closed, the P-type thermoelectric conversion layer 14, the N-type thermoelectric conversion layer 16, the bottom portion electrode 20, and the top portion electrode 24 are omitted in the drawing.

In the example shown in FIG. 5, through holes 68 are formed at 4 locations of the vicinities of both end portions in the arrangement direction and the vicinities of both end portions in the width direction in each sloped surface of the substrate 12 of the thermoelectric conversion module. Each through hole 68 is formed such that the through holes 68 facing to each other in the total sloped surfaces linearly communicate with each other. Reference numeral 72 indicates a reinforcing member formed of a resin material or the like.

Further, in a state in which a wire 70 is inserted into the respective through holes 68 and the thermoelectric conversion module 10 is compressed by the wire 70, the wire 70 is bound to compress the thermoelectric conversion module 10 and close the bellows.

As the wire 70, various materials such as a thread (string), a metal wire, a metal wire covered by an insulating material or the like can be used.

In the example shown in the drawing, total 4 through holes 68 are formed in the vicinities of both end portions in the arrangement direction and the vicinities of both end portions in the width direction in each sloped surface. However, in the present invention, the number of through holes 68 may be 1 to 3 as long as the bellows of the thermoelectric conversion module can be appropriately closed by the wire 70, and if necessary, 5 or more through holes 68 may be formed.

However, it is preferable that the through holes 68 are formed at positions other than the positions where the P-type thermoelectric conversion layer 14, the N-type thermoelectric conversion layer 16, the bottom portion electrode 20, and the top portion electrode 24 are formed irrespective of the number of through holes 68. Thus, the area of the thermoelectric conversion layer or the electrode can be prevented from being reduced and the strength of the thermoelectric conversion module can be secured. Further, even in a case of using the wire 70 having electrical conductivity, a short circuit between the thermoelectric conversion layer or the electrode and the wire can be prevented from occurring.

In the compression member including the through hole 68 and the wire 70, in a case where the bellows of the thermoelectric conversion module 50 shown in FIG. 4C is closed, at least one through hole 68 is provided to communicate both the module main body 52 and the insulating member 53, and by inserting the common wire 70 into the module main body 52 and the insulating member 53, the wire 70 may be used as an alignment member for the module main body 52 and the insulating member 53 and as a compression member.

The thermoelectric conversion module of the present invention basically generates power by imparting a temperature difference between the P-type thermoelectric conversion layer and the N-type thermoelectric conversion layer between the top portion a and the bottom portion b of the bellows.

For example, power generation can be performed such that the thermoelectric conversion module is placed by bringing the bottom portion b side (or the top portion a side) of the bellows into contact with a frame formed of a known highly thermal conductive material such as stainless steel, copper, or aluminum, and the frame is brought into contact with a high temperature portion to cause a temperature difference from the bottom portion b coming into contact with the high temperature portion to the top portion a side on the opposite side.

By bringing the frame formed of a known highly thermal conductive material such as stainless steel, copper, or aluminum into contact with the top portion a side (or the bottom portion b side) on the opposite side and further attaching the frame to a heat dissipation fin, a temperature difference between the end portions of the insulating substrate can be increased can be increased, and thus, the power generation capacity can be improved.

In a case where the thermoelectric conversion module of the present invention is bonded to a heat source to generate power, a thermally conductive adhesive sheet or a thermally conductive adhesive may be used.

The thermally conductive adhesive sheet or the thermally conductive adhesive used by being attached to the heating side or the cooling side of the thermoelectric conversion module is not particularly limited. Accordingly, commercially available thermally conductive adhesive sheets or thermally conductive adhesives can be used. Examples of the thermally conductive adhesive sheets include TC-50TXS2 manufactured by Shin-Etsu Chemical Co., Ltd., hyper soft heat-dissipating material 5580H manufactured by 3M Japan Limited, BFG20A manufactured by Denka Company Limited., and TR5912F manufactured by Nitto Denko Corporation. From the viewpoint of heat resistance, a thermally conductive adhesive sheet formed of a silicone-based gluing agent is preferable. Examples of the thermally conductive adhesives include SCOTCH-WELD EW2070 manufactured by 3M Japan Limited, TA-01 manufactured by Ainex Co., Ltd., TCA-4105, TCA-4210, and HY-910 manufactured by Shiima Electronics, Inc., and SST2-RSMZ, SST2-RSCSZ, R3CSZ, and R3MZ manufactured by SATSUMASOKEN CO., LTD.

The use of the thermally conductive adhesive sheet or the thermally conductive adhesive brings about an effect of increasing the surface temperature of the heating side of the thermoelectric conversion module by improving the adhesiveness with respect to the heat source, an effect of being able to reduce the surface temperature of the cooling side of the thermoelectric conversion module by improving the cooling efficiency, and the like, and thus the power generation capacity can be improved.

Further, on the surface of the cooling side of the thermoelectric conversion module, a heat dissipation fin (heat sink) or a heat dissipation sheet formed of a known material such as stainless steel, copper, or aluminum may be provided. It is preferable to use the heat dissipation fin or the like from because the low temperature side of the thermoelectric conversion module can be more suitably cooled, a big temperature difference is caused between the heat source side and the cooling side, and the thermoelectric conversion efficiency is further improved.

As the heat dissipation fin, it is possible to use various known fins such as T-Wing manufactured by TAIYO WIRE CLOTH CO., LTD, FLEXCOOL manufactured by SHIGYOSOZO KENKYUSHO, a corrugated fin, an offset fin, a waving fin, a slit fin, and a folding fin. Particularly, it is preferable to use a folding fin having a fin height.

The heat dissipation fin preferably has a fin height of 10 to 56 mm, a fin pitch of 2 to 10 mm, and a plate thickness of 0.1 to 0.5 mm. The fin height is more preferably 25 mm or more, because the heat dissipation characteristics are improved, the module can be cooled, and hence the power generation capacity is improved. It is preferable to use a heat dissipation fin formed of aluminum having a plate thickness of 0.1 to 0.3 mm, because such a fin is highly flexible and lightweight.

As the heat dissipation sheet, it is possible to use known heat dissipating sheets such as a PSG graphite sheet manufactured by Panasonic Corporation, COOL STAFF manufactured by Oki Electric Cable Co., Ltd., and CERAC a manufactured by CERAMISSION CO., LTD.

In the above examples, an example in which the thermoelectric conversion module of the present invention is used in the power generation device using a temperature difference has been described. However, the present invention is not limited thereto. For example, it is possible to use the thermoelectric conversion module of the present invention as a Peltier module which performs cooling or heating by energization.

While the thermoelectric conversion module of the present invention has been described above, the present invention is not limited to the above-described examples and various improvements and modifications may of course be made without departing from the spirit of the present invention.

The present invention can be suitably used for a power generation device and the like.

EXPLANATION OF REFERENCES 10, 30, 50: thermoelectric conversion module
12: substrate
14, 54, 100: P-type thermoelectric conversion layer
16, 56, 102: N-type thermoelectric conversion layer
20, 58: bottom portion electrode
24, 60: top portion electrode
32: reset portion
34: connection electrode
52: module main body
53: insulating member
62: insulating sheet
64: thermal conductive layer

What is claimed is:

1. A thermoelectric conversion module comprising:
a substrate which is folded in a bellows-like shape;
a P-type thermoelectric conversion layer and an N-type thermoelectric conversion layer which are alternately provided on each sloped surface between top portions and bottom portions of folds of the substrate on one surface of the substrate; and
a top portion electrode which connects the P-type thermoelectric conversion layer and the N-type thermoelectric conversion layer adjacent to each other in an arrangement direction of the P-type thermoelectric conversion layer and the N-type thermoelectric conversion layer over one top portion, and a bottom portion electrode which connects the P-type thermoelectric conversion layer and the N-type thermoelectric conversion layer adjacent to each other in the arrangement direction over one bottom portion,
wherein the P-type thermoelectric conversion layer and the N-type thermoelectric conversion layer do not extend over the top portion and the bottom portion and positions of the P-type thermoelectric conversion layer and the N-type thermoelectric conversion layer which face each other are not overlapped as viewed in the arrangement direction.

2. The thermoelectric conversion module according to claim 1,
wherein a size of one of the P-type thermoelectric conversion layer and the N-type thermoelectric conversion layer in a width direction orthogonal to the arrangement direction is gradually increased and a size of the other in the width direction is gradually decreased in the arrangement direction, and
facing portions of the top portion electrodes adjacent to each other in the arrangement direction among the top portion electrodes are not overlapped with each other as viewed in the arrangement direction.

3. The thermoelectric conversion module according to claim 2,
wherein the top portion electrode includes a main body portion which extends over the top portion, a first connection portion which connects the main body portion and the P-type thermoelectric conversion layer without extending over the top portion, and a second connection portion which connects the main body portion and the N-type thermoelectric conversion layer without extending over the top portion, and
the main body portions of the top portion electrodes adjacent to each other in the arrangement direction are not overlapped with each other as viewed in the arrangement direction.

4. The thermoelectric conversion module according to claim 2, further comprising:
on the facing sloped surfaces in the middle of the arrangement direction, a reset portion which does not have the thermoelectric conversion layers and has a connection electrode that connects the P-type thermoelectric conversion layer and the N-type thermoelectric conversion layer formed on the sloped surfaces on both sides in the arrangement direction.

5. The thermoelectric conversion module according to claim 4,
wherein a relationship in size in a width direction between the P-type thermoelectric conversion layer and the N-type thermoelectric conversion layer on the facing sloped surfaces positioned on both sides of the reset portion in the arrangement direction is mutually reversed.

6. The thermoelectric conversion module according to claim 1, further comprising:
an insulating member which covers the top portion electrode.

7. The thermoelectric conversion module according to claim 6,
wherein the insulating member is an insulating sheet-like material folded in a bellows-like shape.

8. The thermoelectric conversion module according to claim 7,
wherein the insulating member has a thermal conductive layer on one surface of the insulating sheet-like material.

9. The thermoelectric conversion module according to claim 1, further comprising:
a compression member which compresses the substrate in the arrangement direction.

10. The thermoelectric conversion module according to claim 9,
wherein the compression member has a through hole which is formed on the sloped surface of the substrate, and a wire which is inserted into the through hole.

11. The thermoelectric conversion module according to claim 10,
wherein the through hole is positioned at positions other than the positions where the P-type thermoelectric conversion layer, the N-type thermoelectric conversion layer, the top portion electrode, and the bottom portion electrode are formed.

12. The thermoelectric conversion module according to claim 1,
wherein at least one of the top portion electrode or the bottom portion electrode has a broken cut line matching with a folding line of the substrate.

* * * * *